US010048594B2

(12) United States Patent
Carcasi et al.

(10) Patent No.: US 10,048,594 B2
(45) Date of Patent: Aug. 14, 2018

(54) PHOTO-SENSITIZED CHEMICALLY AMPLIFIED RESIST (PS-CAR) MODEL CALIBRATION

(71) Applicant: Tokyo Electron Limited, Minato-ku, Tokyo (JP)

(72) Inventors: Michael Carcasi, Austin, TX (US); Mark Somervell, Austin, TX (US); Carlos Fonseca, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 48 days.

(21) Appl. No.: 15/048,619

(22) Filed: Feb. 19, 2016

(65) Prior Publication Data

US 2017/0242344 A1 Aug. 24, 2017

(51) Int. Cl.
*G03F 7/20* (2006.01)
(52) U.S. Cl.
CPC ........ *G03F 7/70516* (2013.01); *G03F 7/2004* (2013.01); *G03F 7/2022* (2013.01)
(58) Field of Classification Search
CPC .... G03F 7/2022; G03F 7/2002; G03F 7/2004; G03F 7/70516
USPC .......................................... 430/30, 330, 394
See application file for complete search history.

(56) References Cited

U.S. PATENT DOCUMENTS

| | | |
|---|---|---|
| 4,402,571 A | 9/1983 | Cowan et al. |
| 4,609,615 A | 9/1986 | Yamashita et al. |
| 4,751,169 A | 6/1988 | Behringer et al. |
| 4,804,612 A | 2/1989 | Asaumi et al. |
| 4,931,380 A | 6/1990 | Owens et al. |
| 4,933,263 A | 6/1990 | Okuda et al. |
| 5,370,973 A | 12/1994 | Nishii |
| 5,534,970 A | 7/1996 | Nakashima et al. |
| 5,707,784 A | 1/1998 | Oikawa et al. |
| 5,820,679 A | 10/1998 | Yokoyama et al. |
| 5,905,019 A | 5/1999 | Obszamy |
| 6,180,320 B1 | 1/2001 | Saito et al. |
| 6,242,160 B1 | 6/2001 | Fukuzawa et al. |
| 6,245,492 B1 | 6/2001 | Huang et al. |
| 6,296,985 B1 | 10/2001 | Mizutani et al. |
| 6,331,383 B1 | 12/2001 | Sakai |
| 6,440,632 B2 | 8/2002 | Yasuda |
| 6,555,479 B1 | 4/2003 | Hause et al. |
| 6,844,135 B2 | 1/2005 | Kon et al. |
| 6,900,001 B2 | 5/2005 | Livesay et al. |
| 6,968,253 B2 | 11/2005 | Mack et al. |
| 7,142,941 B2 | 11/2006 | Mack et al. |
| 7,327,436 B2 | 2/2008 | Fukuhara et al. |
| 7,488,933 B2 | 2/2009 | Ye et al. |
| 7,829,269 B1 | 11/2010 | Fonseca et al. |
| 7,858,289 B2 | 12/2010 | Yamashita |
| 7,966,582 B2 | 6/2011 | Melvin, III et al. |
| 8,088,548 B2 | 1/2012 | Houlihan et al. |
| 8,428,762 B2 | 4/2013 | Graves et al. |
| 8,443,308 B2 | 5/2013 | Shiely et al. |
| 8,589,827 B2 | 11/2013 | Biafore et al. |
| 9,009,647 B2 * | 4/2015 | Ye .......................... G03F 1/144 716/132 |
| 9,519,227 B2 | 12/2016 | Carcasi et al. |
| 9,618,848 B2 | 4/2017 | Carcasi et al. |
| 9,645,495 B2 | 5/2017 | deVilliers |
| 9,746,774 B2 | 8/2017 | Carcasi et al. |
| 2002/0030800 A1 | 3/2002 | Nellissen |
| 2002/0102490 A1 | 8/2002 | Ito et al. |
| 2003/0163295 A1 | 8/2003 | Jakatdar et al. |
| 2005/0008864 A1 | 1/2005 | Ingen Schenau et al. |
| 2005/0214674 A1 | 9/2005 | Sui et al. |
| 2006/0040208 A1 | 2/2006 | Tarutani et al. |
| 2006/0269879 A1 | 11/2006 | Elian et al. |

(Continued)

FOREIGN PATENT DOCUMENTS

CN 101738872 B 4/2013
EP 583205 A1 2/1994

(Continued)

OTHER PUBLICATIONS

S. Tagawa, et al., "Super High Sensitivity Enhancement by Photo-Sensitized Chemically Amplified Resist Process", Journal of Photopolymer Science and Technology, vol. 26, No. 6 (2013), pp. 825-830.
S. Tagawa, et al., "New Sensitization Method of Chemically Amplified EUV/EB Resists," presented at the 2013 International Symposium on EUV Lithography. Toyama, Japan Oct. 6-10, 2013.
A Ravve, "Light-Associated Reactions of Synthetic Polymers", Springer Science-Business Media, ISBN 0387318038, pp. 23-25, 2006.
International Searching Authority, Search Report and Written Opinion issued in related International Application PCT/US2015/017056, dated May 29, 2015, 10 pp.
International Searching Authority, Search Report and Written Opinion issued in related International Application PCT/US2015/017071 dated May 29, 2015, 13 pp.

(Continued)

*Primary Examiner* — Christopher G Young
(74) *Attorney, Agent, or Firm* — Wood Herron & Evans LLP

(57) ABSTRACT

Methods and systems for PS-CAR photoresist simulation are described. In an embodiment, a method includes calibrating initial conditions for a simulation of at least one process parameter of a lithography process using a radiation-sensitive material. In such an embodiment, the radiation-sensitive material includes a first light wavelength activation threshold that controls the generation of acid to a first acid concentration in the radiation-sensitive material and controls generation of photosensitizer molecules in the radiation-sensitive material, and a second light wavelength activation threshold that can excite the photosensitizer molecules in the radiation-sensitive material that results in the acid comprising a second acid concentration that is greater than the first acid concentration, the second light wavelength being different from the first light wavelength. Further, the method may include performing a lithography process using the previously-determined at least one process parameter.

15 Claims, 21 Drawing Sheets

(56) References Cited

U.S. PATENT DOCUMENTS

| | | |
|---|---|---|
| 2007/0032896 A1 | 2/2007 | Ye et al. |
| 2007/0184648 A1 | 8/2007 | Yoon et al. |
| 2007/0275330 A1 | 11/2007 | Bailey et al. |
| 2007/0292770 A1 | 12/2007 | Strauss |
| 2008/0038675 A1 | 2/2008 | Nagasaka |
| 2008/0230722 A1 | 9/2008 | Elian |
| 2009/0162796 A1 | 6/2009 | Yun et al. |
| 2009/0214985 A1 | 8/2009 | Kulp |
| 2009/0274974 A1 | 11/2009 | Abdallah et al. |
| 2010/0119972 A1 | 5/2010 | Houlihan et al. |
| 2010/0213580 A1 | 8/2010 | Meador et al. |
| 2010/0245790 A1 | 9/2010 | Seltmann et al. |
| 2010/0273099 A1 | 10/2010 | Fonseca et al. |
| 2010/0291490 A1 | 11/2010 | Tsuruda et al. |
| 2011/0043791 A1 | 2/2011 | Smilde et al. |
| 2011/0147984 A1 | 6/2011 | Cheng et al. |
| 2011/0171569 A1 | 7/2011 | Nishimae et al. |
| 2011/0177464 A1 | 7/2011 | Takeda et al. |
| 2011/0205505 A1 | 8/2011 | Somervell et al. |
| 2011/0250540 A1 | 10/2011 | Huang et al. |
| 2013/0084532 A1 | 4/2013 | Wu et al. |
| 2013/0164691 A1 | 6/2013 | Shiobara |
| 2013/0171571 A1 | 7/2013 | Dunn et al. |
| 2013/0232457 A1 | 9/2013 | Ye et al. |
| 2013/0234294 A1 | 9/2013 | Hu et al. |
| 2013/0260313 A1 | 10/2013 | Allen et al. |
| 2014/0227538 A1 | 8/2014 | Baldwin et al. |
| 2015/0214056 A1 | 7/2015 | Xu et al. |
| 2015/0241781 A1 | 8/2015 | Carcasi et al. |
| 2015/0241782 A1 | 8/2015 | Scheer et al. |
| 2015/0241783 A1 | 8/2015 | Carcasi et al. |
| 2015/0241793 A1 | 8/2015 | Carcasi et al. |
| 2016/0004160 A1 | 1/2016 | Tagawa et al. |
| 2016/0048080 A1 | 2/2016 | deVilliers |
| 2016/0357103 A1 | 12/2016 | Nagahara et al. |
| 2017/0052448 A1 | 2/2017 | Nakagawa et al. |
| 2017/0052449 A1 | 2/2017 | Nakagawa et al. |
| 2017/0052450 A1 | 2/2017 | Nakagawa et al. |
| 2017/0242342 A1 | 8/2017 | Carcasi et al. |
| 2017/0242344 A1 | 8/2017 | Carcasi et al. |
| 2017/0329229 A1 | 11/2017 | Carcasi et al. |

FOREIGN PATENT DOCUMENTS

| | | |
|---|---|---|
| EP | 2048700 A2 | 4/2009 |
| JP | 09-211871 A | 8/1992 |
| JP | 2000-208408 A | 7/2000 |
| JP | 2002006512 A | 1/2002 |
| JP | 2007501431 A | 1/2007 |
| JP | 2007334036 A | 12/2007 |
| JP | 04-239116 B2 | 3/2009 |
| JP | 2015172741 A | 10/2015 |
| KR | 20120058572 A | 6/2012 |
| TW | I273457 B | 2/2007 |
| TW | 201539539 A | 10/2015 |
| TW | 201541194 A | 11/2015 |
| WO | 2003001297 A2 | 1/2003 |
| WO | 2013007442 A1 | 1/2013 |
| WO | 2005013007 A1 | 2/2015 |

OTHER PUBLICATIONS

International Bureau of WIPO, International Preliminary Report on Patentability issued in related International Application No. PCT/US2015/017056 on Aug. 30, 2016, 7 pp.

International Bureau of WIPO, International Preliminary Report on Patentability issued in related International Application No. PCT/US2015/017071 on Aug. 30, 2016, 10 pp.

Nternational Bureau of WIPO, International Preliminary Report on Patentability issued in corresponding International Application No. PCT/US2015/017056 on Aug. 30, 2016, 7 pp.

Lowes et al. "Comparative study of photosensitive versus Non-photosensitive developer-soluble bottom anti-reflective coating system", ECS Transactions 27(1) pp. 503-508 (2010).

"Understanding Brewer Science ARC products", Brewer Science (23 pages (2002)).

Japan Patent Office, Official Action issued in related JP Patent Application No. 2016-553436 dated May 23, 2017, 18 pp., including English translation.

U.S. Patent and Trademark Office, Fiinal Office Action issued in related U.S. Appl. No. 14/629,968 dated Jun. 1, 2017, 20 pp.

Japan Patent Office, Official Action issued in related JP Patent Application No. 2016-553422 dated May 30, 2017, 8 pp., including English translation.

Nagahara et al., Challenge Toward Breakage of RLS Trade-off for UEV Lithography by Photosensitized Chemically Amplified Resist (PSCAR) with Flood Exposure, SPIE International Society for Optical Engineering Proceedings, vol. 9776, Mar. 18, 2016, 18 pp.

International Searching Authority, Search Report and Written Opinion issued in related International Application PCT/US2017/032435, dated Aug. 14, 2017, 14 pp.

International Searching Authority, Search Report and Written Opinion issued in related International Application PCT/US2017/032450, dated Aug. 10, 2017, 12 pp.

US Patent and Trademark Office, Office Action issued in related U.S. Appl. No. 14/629,968 dated Aug. 23, 2017, 27 pp.

International Searching Authority, Search Report and Written Opinion issued in related International Application PCT/US2017/018332 dated Jun. 1, 2017, 12 pp.

International Searching Authority, Search Report and Written Opinion issued in related International Application PCT/US2017/018337 dated Jun. 5, 2017, 12 pp.

Korean Intellectual Property Office, English translation of Office Action issued in related KR Patent Application No. 2016-7025792 dated Oct. 18, 2017, 7 pp.

Japan Patent Office, Office Action issued in related JP Application No. 2016-553436 dated Dec. 12, 2017, 16 pp. including English translation.

Korean Intellectual Property Office, English translation of Office Action issued in related KR Patent Application No. 2016-7026114 dated Oct. 17, 2017, 5 pp.

Taiwan Intellectual Property Office, Notice of Examination Opinions issued in counterpart application TW Application No. 106105400 dated Mar. 28, 2018, 13 pp, including English translation.

U.S. Patent and Trademark Office, Non-final Office Action issued in corresponding U.S. Appl. No. 15/594,187 dated Mar. 22, 2018, 53 pp.

U.S. Patent and Trademark Office, Non-final Office Action issued in corresponding U.S. Appl. No. 15/445,738 dated Apr. 11, 2018, 56 pp.

* cited by examiner

PHOTO-SENSITIZED CHEMICALLY AMPLIFIED RESIST (PS-CAR) MODEL CALIBRATION

BACKGROUND OF THE INVENTION

Field of Invention

The present invention relates to systems and methods for substrate processing, and more particularly to a method and system for Photo-sensitized Chemically Amplified Resist (PS-CAR) model calibration.

Description of Related Art

In lithographic patterning of semiconductor devices, shrinking technology nodes, and thus feature sizes are driving wavelengths into the extreme ultraviolet (EUV) range. At this time, EUV light sources are still under active development, and currently are not capable of developing and delivering the levels of illumination of prior generations of light sources. To address these shortcomings and still be able to utilize the current generation of EUV light sources, a resist chemistry and associated methods have been developed, called Photo-Sensitized Chemically-Amplified resist (PS-CAR). PS-CAR, like traditional Chemically-Amplified resist (CAR), utilizes acid generated within the resist feature for deprotection, but acid is generated in a two-step illumination process, unlike CAR where only a single patterned exposure is used.

In PS-CAR, a first patterned exposure is used, often at EUV frequencies, to generate a pattern (latent image within the resist) with a relatively small amount of generated acid, and at the same time generate a photosensitizer (PS) compound, for example from a photosensitizer generator added to the PS-CAR resist. Both the acid and photosensitizer (PS) are generated only in illuminated portions of the PS-CAR resist, during the first patterned exposure. Thereafter, a flood exposure is performed, i.e. with no pattern, at a second wavelength of light different than the wavelength of the first paterned exposure. The PS-CAR resist chemistry is chosen such that the photosensitizer (PS) is sensitive to the second wavelength of light used in the second flood exposure, while other resist components are not. The photosensitizer (PS), wherever present in the pattern formed during the first EUV patterned exposure causes further generation of acid during the flood exposure, with tenfold increases of acid concentration, for example, being possible. This photosensitizer-induced acid concentration increase results in greatly increased contrast, which allows more process latitude particularly with respect to the RLS tradeoff (Resolution—Line Width Roughness—Sensitivity). Thus, PS-CAR presents an enabling technology for EUV lithography because it allows the productive use of EUV sources and lithography at their present power levels.

It should be noted here that PS-CAR processes may involve additional steps, for example between the EUV patterned exposure and the flood exposure. The above description was simplified for purposes of clarity. Also, in some PS-CAR chemistry embodiments, no acid may be generated during the first EUV patterned exposure, and only photosensitizer may be generated, which generated photosensitizer causes generation of all acid during the flood exposure. Alternatively yet, acid may be generated in small quantities, as explained before, but it may be effectively consumed by competing chemical reactions, such as quenching events (depending on the amount of quencher present in the PS-CAR resist).

PS-CAR resist deposition, dosing, patterning, and developing may be highly sensitive processes in some embodiments. Due to the complexity of PS-CAR resist chemistries, and the scale of patterned features, many variables may contribute to the quality of the resist mask, and therefore, the resulting etched features. Resist patterning models have been used to predict resist layer and pattern qualities and to fine tune resist processing parameters, however none of the traditional models are suitable for patterning PS-CAR for a variety of reasons. First, PS-CAR resist processing flows include additional steps which are not required in traditional CAR resist flows. Previous models do not account for these additional flow steps. Second, PS-CAR resist is more sensitive to EUV and UV exposure dosing than traditional CAR resist, and prior models do not account for such sensitivities. Third, traditional models are designed with preset parameters tuned to the chemistry of traditional CAR chemistries, not for PS-CAR chemistries. One of ordinary skill will recognize a variety of additional shortcomings of prior models used for simulation traditional CAR resists.

SUMMARY OF THE INVENTION

Methods and systems for PS-CAR photoresist simulation are described. In an embodiment, a method includes calibrating initial conditions for a simulation of at least one process parameter of a lithography process using a radiation-sensitive material. In such an embodiment, the radiation-sensitive material includes a first light wavelength activation threshold that controls the generation of acid to a first acid concentration in the radiation-sensitive material and controls generation of photosensitizer molecules in the radiation-sensitive material, and a second light wavelength activation threshold that can excite the photosensitizer molecules in the radiation-sensitive material that results in the acid comprising a second acid concentration that is greater than the first acid concentration, the second light wavelength being different from the first light wavelength. Further, the method may include performing a lithography process using the previously-determined at least one process parameter.

Another embodiment of a method includes receiving, at an input interface, a physical parameter of a radiation-sensitive material for use in the lithography process. The method may also include receiving, at the input interface, an exposure parameter associated with at least one of a first radiation exposure step and a second radiation exposure step of the lithography process. Additionally, the method may include calculating, using a data processor, a profile of the radiation-sensitive material according to a lithography process model, and in response to the physical parameter and the radiation exposure parameter. In an embodiment, the method may include receiving, at the input interface, feedback indicative of an error value corresponding to a comparison of the profile of the radiation-sensitive material and an experimental verification of the model. Further, the method may include optimizing, using the data processor, at least one of the physical parameter and the exposure parameter in response to the feedback. Additionally, the method may include generating an output, at an output interface, comprising at least one of the optimized physical parameter and the optimized exposure parameter in response to a determination that the error value is within a threshold margin of error.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

DETAILED DESCRIPTION OF EMBODIMENTS OF THE INVENTION

Figure 1:
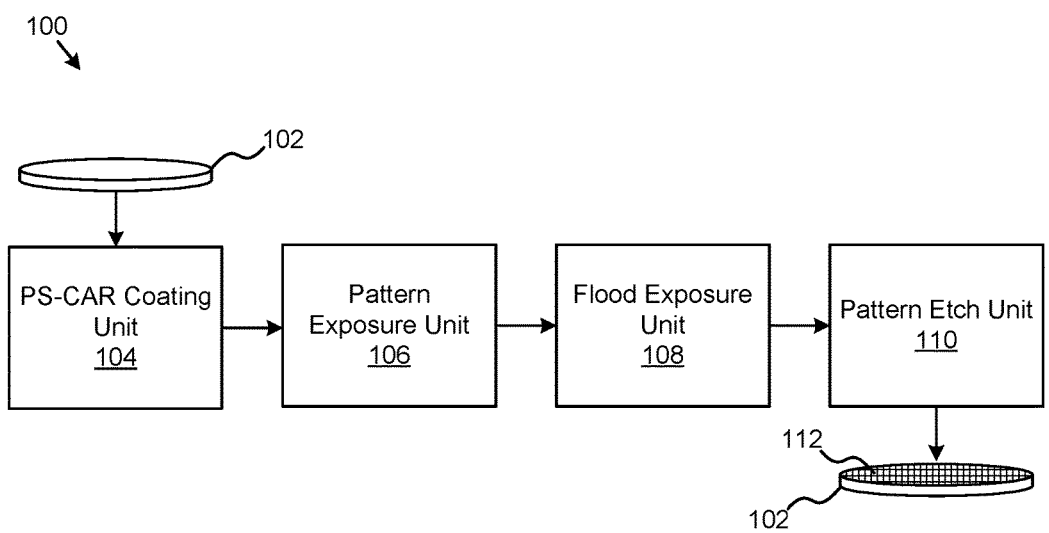
FIG. 1 is an embodiment of a semiconductor wafer processing system.

Embodiments of the present invention relate to design and control of a process, apparatus, and system for patterning a layer on a substrate, in semiconductor manufacturing.

In the following description, in order to facilitate a thorough understanding of the invention and for purposes of explanation and not limitation, specific details are set forth, such as particular geometries of a mask, coater/developer, exposure tools, and descriptions of various components and processes. However, it should be understood that the invention may be practiced in other embodiments that depart from these specific details.

In the description to follow, the terms radiation-sensitive material and photoresist may be used interchangeably, photoresist being only one of many suitable radiation-sensitive materials for use in photolithography. Similarly, hereinafter the term substrate, which represents the workpiece being processed, may be used interchangeably with terms such as semiconductor wafer, LCD panel, light-emitting diode (LED), photovoltaic (PV) device panel, etc., the processing of all of which falls within the scope of the claimed invention.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Furthermore, the use of photo-sensitized chemically-amplified resist (PS-CAR) is not limited only to resist (photoresist), but similar light-sensitive chemistries can be implemented in antireflective coatings (ARC), bottom antireflective coatings (BARC), developer-soluble bottom antireflective coatings (DBARC), overcoat materials, smart slim materials, etc. It is understood that the PS-CAR chemistries and methods described herein may be applied to all these materials and patterning thereof, and therefore the terms resist, photoresist, and radiation-sensitive material will be used interchangeably hereinafter to refer to all of these materials.

The photo-sensitized chemically-amplified resist (PS-CAR) concept is described in some detail below. In contrast to traditional resist processing wherein a single patterned exposure (i.e. through a mask) generates regions of de-protected (positive-tone) or protected (negative-tone) resist that define soluble and insoluble regions, respectively, PS-CAR processing relies on a first patterned exposure at a first wavelength of light to amplify sensitivity of the resist to a second chemically-selective flood exposure at a second wavelength of light, which defines the final pattern. The second wavelength of light is chosen to be different than the first wavelength of light. This enables higher sensitivity patterning when photon density is low. The photosensitizer (PS) is created during the first EUV patterned exposure, and only in exposed regions of the resist. Electron beam (eBeam), KrF, or ArF exposure can also be used for the first patterned exposure.

The choice of flood exposure wavelength is dictated by the requirement that the absorption by the photosensitizer (PS) be maximized while minimizing the absorbance by the photo acid generator (PAG) or the PS generator in the resist. Typically, the flood exposure wavelength of light is in the UV portion of the light spectrum. The photosensitizer (PS) excited by the second flood exposure will decompose photoacid generator (PAG) molecules in its vicinity causing amplification of acid generation in regions that were exposed in the first EUV patterned exposure, while essentially maintaining no acid formation in unexposed regions. This means there is no DC-bias shift that is typically present in traditional flood exposure processes.

The resist thus may include a separate activation thresholds that enables the generation of chemicals within the resist to occur at different times under different process conditions, prior to being developed. Specifically, the concept is to isolate the generation of photosensitizer (PS) and acid amplification from one another, within the resist. In some PS-CAR chemistry embodiments, only the photosensitizer and no acid are generated during the first EUV patterned exposure, the acid generation and amplification occurring entirely during the subsequent second flood exposure. In these embodiments, there is no overlap in the light sensitivity ranges of the photosensitizer generator and the photoacid generator (PAG). In other PS-CAR chemistry embodiments, the photosensitizer generator and photoacid generator (PAG) light sensitivity ranges may overlap slightly, such that photosensitizer (PS) is generated concurrently with a relatively small amount of acid, typically less than about half of the final amount of generated acid after amplification, during the first EUV patterned exposure. This initially generated amount of acid is then amplified in the second flood exposure. In exemplary embodiments of PS-CAR, the first (EUV) wavelength of light may be less than 300 nm while the second wavelength of light used for second flood exposure may be greater than 300 nm, typically about 365 nm.

In an embodiment, the resist may include a photosensitizer generator comprising a first light wavelength activation threshold that controls generation of photosensitizer (PS) molecules in the resist layer and a photoacid generation (PAG) compound comprising a second light wavelength activation threshold that controls the generation and amplification of acid in the resist layer, wherein the second activation wavelength is different than the first activation wavelength, as mentioned before. The photosensitizer molecule may be chosen to absorb light energy and transfer the light energy to another molecule, for example a photoacid generator (PAG). Some photosensitizer (PS) molecules may transfer energy in a ground state while other may transfer energy in an excited state. In an embodiment, the photosensitizer generator of PS-CAR resist may comprise at least one of acetophenone, triphenylene, benzophenone, flourenone, anthraquinone, phenanthrene, or derivatives thereof. In an embodiment, the photoacid generator (PAG) may be a cationic photoinitiator that may convert absorbed light energy into chemical energy, for example an acidic reation. The photoacid generator (PAG) may comprise at least one of triphenylsulfonium triflate, triphenylsulfonium nonaflate, triphenylsulfonium perfluorooctylsulfonate, triarylsulfonium triflate, triarylsulfonium nonaflate, triarylsulfonium perfluorooctylsulfonate, a triphenylsulfonium salt, a triarylsulfonium salt, a triarylsulfonium hexafluoroantimonate salt, N-hydroxynaphthalimide triflate, 1,1-bis[p-chlorophenyl]-2,2,2-trichloroethane(DDT), 1,1-bis[p-methoxyphenyl]-2,2,2-trichloroethane, 1,2,5,6,9,10-hexabromocyclododecane, 1,10-dibromodecane, 1,1-bis[p-chlorophenyl]2,2-dichloroethane, 4,4-dichloro-2-(trichloromethyl)benzhydrol, 1,1-bis(chlorophenyl) 2-2,2-trichloroethanol, hexachlorodimethylsulfone, 2-chloro-6-(trichloromethyl)pyridine, or derivatives thereof.

FIG. 1 is an embodiment of a semiconductor wafer processing system 100. In an embodiment, a semiconductor substrate 102, such as a silicon wafer, is inserted into a PS-CAR photoresist coating unit 104. The semiconductor substrate 102 may then be coated with one or more layers of PS-CAR photoresist. The substrate 102 may then be passed to a pattern exposure unit 106, such as a EUV exposure unit, for patterning of the PS-CAR photoresist layer. After patterning, the substrate 102 may be exposed to a second wavelength of light, such as a flood of UV light in the flood exposure unit 108 for further development of the PS-CAR photosensitizer and other acid-generating components of the PS-CAR chemistry. The substrate 102 may then be passed to a pattern etch unit 110 for patterned etching of one or more layers on the substrate as defined by the PS-CAR photoresist patterned mask. The resulting substrate 102 may include one or more physical features 112 formed therein, or in one or more layers deposited on the substrate 102. One of ordinary skill will recognize that additional steps and/or functional units may be included in system 100. For example, the wafer 102 may be placed in proximity to a heating element for Post Exposure Bake (PEB) or for a pre-PEB diffusion process. Additionally, one or more portions of the PS-CAR photoresist layer may be removed prior to etching in a wet etch processing chamber, a cleaning chamber, or a photoresist selective dry etch chamber. Additionally, the PS-CAR layer(s) may be developed in a dedicated developer unit, or the like. These additional modules or units have not been illustrated in order to simplify the discussion of the technologies presented herein. These additional details will be known to one of ordinary skill in the art.

Figure 2A:
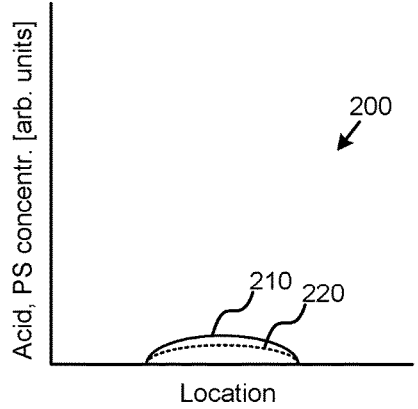
FIG. 2A shows an embodiment of photosensitizer and acid concentration profiles following an EUV patterned exposure step in a PS-CAR patterning process
Figure 2B:
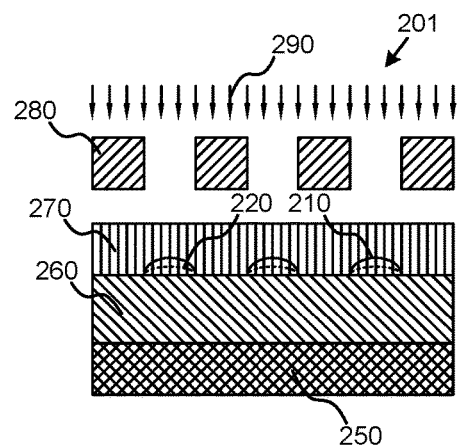
FIG. 2B shows a device cross section following an EUV patterned exposure step in a PS-CAR patterning process.

To further assist understanding, FIGS. 2A-D describe the PS-CAR patterning process prior to subsequent development and etching steps. In FIG. 2B, a substrate 250 is provided that is coated or modified to form an underlying layer 260, which is to be patterned. A PS-CAR resist 270 is applied using, for example, spin-on dispense techniques, to the exposed surface of the underlying layer 260. In the first EUV patterned exposure 201, a first wavelength of light 290 is exposed onto the PS-CAR resist 270 through a mask 280, to form alternating exposed and unexposed regions inside PS-CAR resist 270. During this exposure, photosensitizer (PS) is generated from the photosensitizer generator in exposed regions of the PS-CAR resist 270, to form photosensitizer (PS) concentration profiles 220, which are also shown enlarged in FIG. 2A with graphs 200 of photosensitizer (PS) and acid concentrations, 220 and 210, respectively. Depending on the PS-CAR resist chemistry, in some embodiments, acid may also be formed during first EUV patterned exposure 101 from photoacid generators (PAG) molecules inside PS-CAR resist 270, to form acid concentration profiles 210. In other embodiments, where there is no overlap between photosensitizer generator and photoacid generator (PAG) light sensitivity ranges, as described before, no acid is generated during the first EUV patterned exposure 201.

Figure 2C:
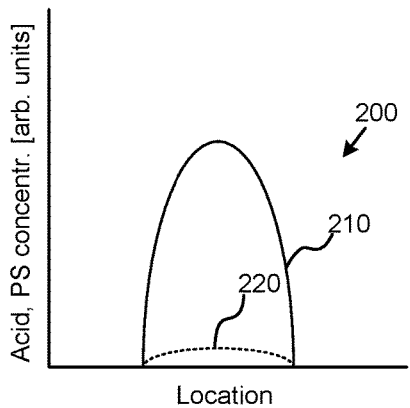
FIG. 2C shows photosensitizer and acid concentration profiles following a flood exposure step in a PS-CAR patterning process.
Figure 2D:
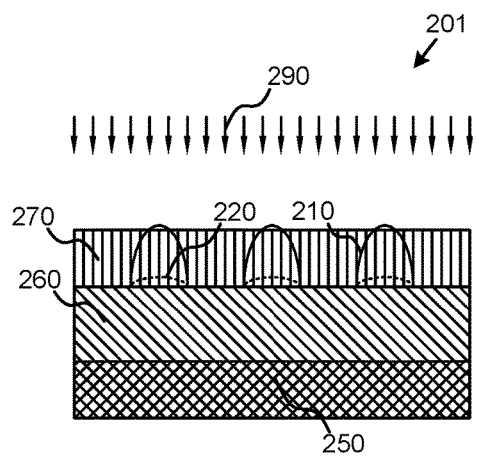
FIG. 2D shows a device cross section following a flood exposure step in a PS-CAR patterning process.

Subsequently, as shown in FIG. 2D, the substrate 250, with underlying layer 260 and pattern-exposed PS-CAR resist 270 is now subjected to a second flood exposure 201 using a second wavelength of light 290 different than the first wavelength of light 290, where the second flood exposure causes photosensitizer (PS) molecules generated in previously exposed (i.e. unmasked) regions to amplify acid generation from photoacid generator (PAG) molecules in their vicinity, thereby forming acid concentration profiles 210. Acid concentration profiles 210 have higher peaks and therefore a better contrast than acid concentration profiles 210 following the first EUV patterned exposure 201. Even though a second flood exposure 201 is involved, unlike in traditional flood exposure processing there is no generation of acid in regions that were unexposed (masked) during the first EUV patterned exposure 201, thus there is no DC-bias and a high contrast is maintained. This is because in PS-CAR acid generation and amplification occur only in the presence of photosensitizer (PS). Typically, photosensitizer (PS) concentration profiles 220 undergo little change after second flood exposure 201 from initial photosensitizer (PS) concentration profiles 220, but in certain chemistry embodiments, larger changes may occur between photosensitizer (PS) concentrations 220 and 210. FIG. 2C shows graphs 200 of photosensitizer (PS) and acid concentration profiles, 220 and 210, respectively, following the second flood exposure 201.

With the amplified acid concentration profiles 210 now present in the PS-CAR resist 270, forming a latent image, the substrate is now ready for subsequent patterning process steps, such as bakes, development, and etching of the underlying layer 260, to complete the patterning process following traditional steps. In some embodiments, additional processing steps may be made between the first EUV patterned exposure 201 and second flood exposure 201, such as baking steps, etc. Furthermore, while the process is described herein using PS-CAR resist 270 as an example, the same process is applicable to any other materials such as ARC, BARC, DBARC, overcoat materials, etc. layers including a PS-CAR chemistry.

Figure 3A:
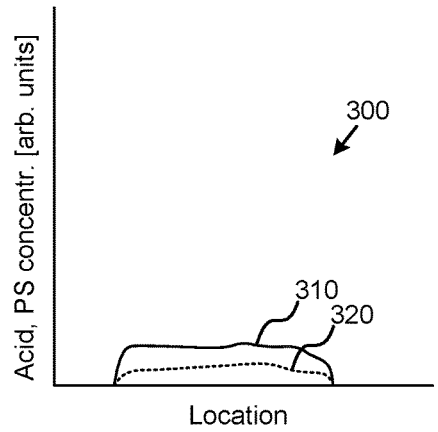
FIG. 3A shows photosensitizer and acid concentration profiles prior to a flood exposure step, with illustrated effects of unmitigated EUV shot noise in a PS-CAR patterning process.
Figure 3B:
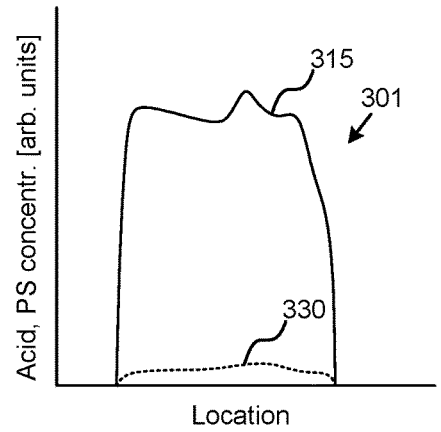
FIG. 3B shows photosensitizer and acid concentration profiles following a flood exposure step, with illustrated effects of unmitigated EUV shot noise in a PS-CAR patterning process.

FIGS. 2A-2D showed what ideal photosensitizer (PS) and acid concentration profiles may look like. FIG. 3A shows an exemplary photosensitizer (PS) concentration profile 320 and an acid concentration profile 310 with effects of EUV shot noise accrued during the first EUV patterned exposure 201. EUV shot noise causes a departure from ideal concentration profiles 210 and 220, respectively, of FIG. 2A. If such non-ideal photosensitizer (PS) concentration profile 320 and an acid concentration profile 310 are now subjected to a second flood exposure 201, the second flood exposure 201 may amplify the irregularities of the acid concentration profile 310 into a final acid concentration profile 315, with loss of contrast, as shown in FIG. 3B. The loss of contrast in acid concentration profile 315 is a major contributor to line width roughness (LWR) in patterning (or LER or CER, depending on device type), and measures to mitigate this loss of contrast due to EUV shot noise are required to maintain pattern integrity.

The inventors have conceived of a number of possible ways to mitigate this loss of contrast due to EUV shot noise. Most of these methods are based on including an intermediate step between the first EUV patterned exposure 201 and the second flood exposure 201, in which the generated photosensitizer (PS) is allowed to diffuse within its vicinity, to smooth out the irregularities caused by EUV shot noise.

Figure 3C:
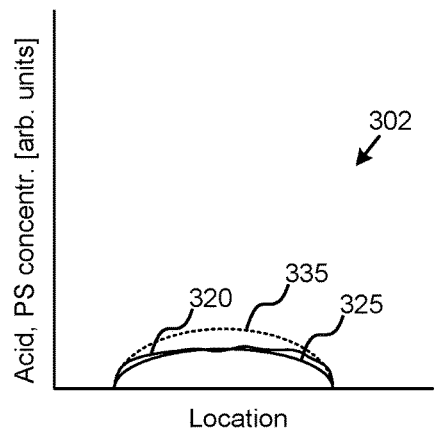
FIG. 3C shows photosensitizer concentration profiles prior to an EUV shot noise mitigation step, and an acid concentration profile following the EUV shot noise mitigation step in a PS-CAR patterning process in accordance with an embodiment of the invention.
Figure 3D:
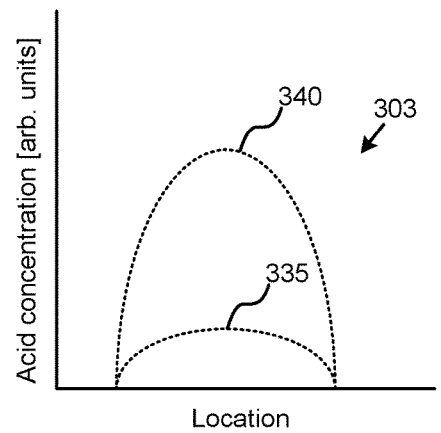
FIG. 3D shows exemplary acid concentration profiles following the EUV shot noise mitigation step and following a flood exposure step in a PS-CAR patterning process in accordance with an embodiment of the invention

FIG. 3C shows graphs of photosensitizer (PS) concentration profile 320 prior to and photosensitizer (PS) concentration profile 325 following the photosensitizer diffusion step. The photosensitizer (PS) concentration profile 325 is smoother that the EUV shot-noise-affected photosensitizer (PS) concentration profile 320, and should greatly reduce deviations from ideal of the final acid concentration profile. The acid concentration profile 335 after diffusion of photosensitizer (PS) is also shown in FIG. 3C. With the diffused and smoothed photosensitizer (PS) concentration profile 325, the process proceeds with the second flood exposure to generate and amplify the acid. During this process, a final acid concentration profile 340 is reached, as shown in FIG. 3D, which is much improved over the concentration profile 315 of FIG. 3B which is obtained without steps to mitigate EUV shot noise.

Figure 4:
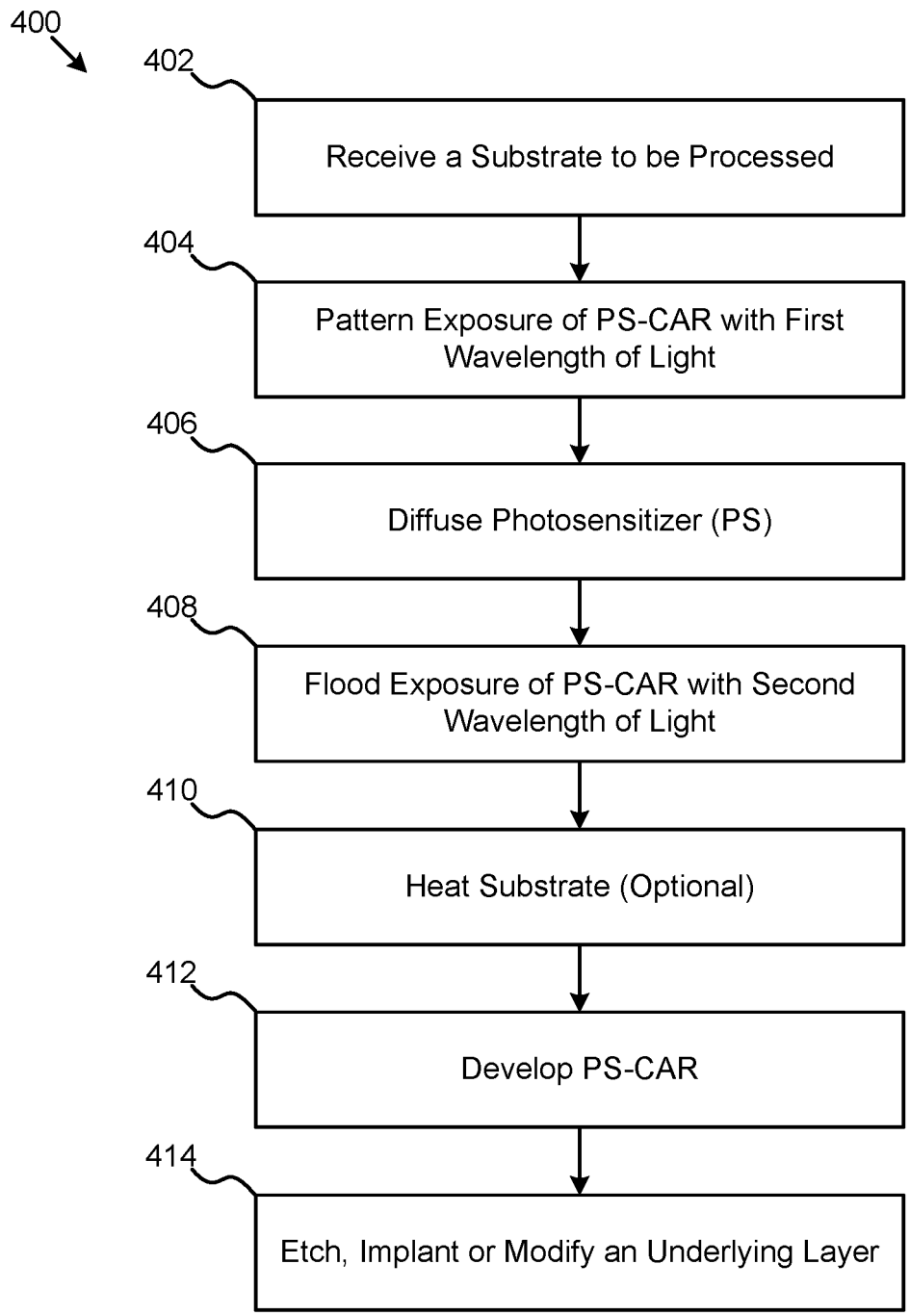
FIG. 4 shows a process flow for a PS-CAR patterning process in accordance with an embodiment of the invention.

With reference now to FIG. 4, therein is shown a flowchart 400 of a PS-CAR patterning process with EUV shot noise mitigation. In step 402, a substrate is provided, such as substrate 250 with underlying layer 260 to be patterned formed thereupon, and a PS-CAR resist 170 deposited atop the underlying layer 260. In step 404, the PS-CAR resist is subjected to a first EUV patterned exposure using a first wavelength of light, typically in the EUV range, thus activating the first activation threshold to generate photosensitizer (PS) from photosensitizer generator present in the PS-CAR resist 270. In step 406, the generated photosensitizer (PS) molecules are allowed to diffuse to mitigate effects of EUV shot noise. In step 408, the PS-CAR resist 270 is subjected to a second flood exposure at a second wavelength of light different than the first wavelength of light, to activate a second activation threshold and cause generation and amplification of acid from photoacid generator (PAG) molecules in the PS-CAR resist 270, to generate a final acid concentration profile corrected for effects of EUV shot noise, as explained before.

With continued reference to FIG. 4, further patterning steps may include traditional patterning steps, such as an subsequent bake process 410 during which the substrate is heated, followed by a development process 412 in which the PS-CAR resist 270 is developed to form a patterned mask for subsequent processing of the underlying layer 260. Lastly, the process concludes at the actual process 414 in which the underlying layer 260 is etched, implanted, or modified using developed PS-CAR resist as a mask. All these processes are well known to those skilled in the art of semiconductor lithographic patterning, and will thus not be discussed in detail herein.

In the simplest embodiment, allowing sufficient time between the first EUV patterned exposure and the second flood exposure for the generated photosensitizer (PS) molecules to diffuse represents the simplest embodiment of the step 406 of diffusing photosensitizer (PS) molecules. However, this approach may cause a processing throughput penalty because of substrates held between exposures to allow diffusion to take place.

Figure 5:
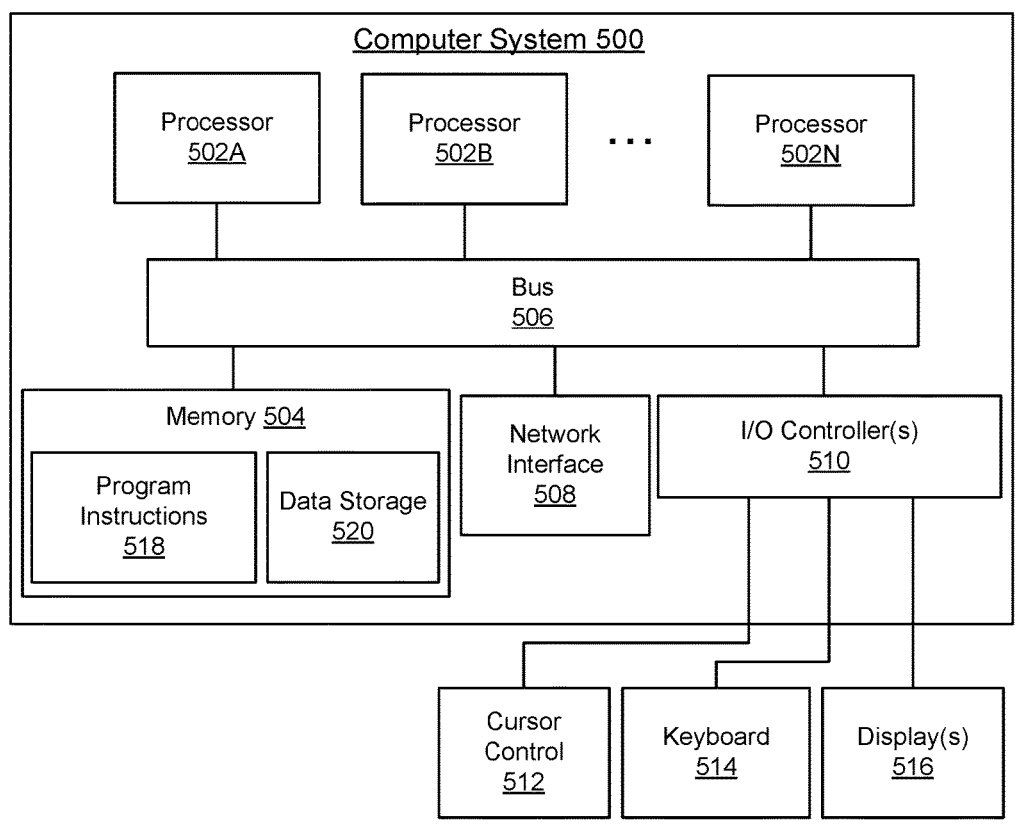
FIG. 5 is a schematic block diagram illustrating one embodiment of a data processing system configured for PS-CAR photoresist simulation.

FIG. 5 is a schematic block diagram illustrating one embodiment of a data processing system 500 configured for PS-CAR photoresist simulation. In one embodiment, elements illustrated in FIG. 6 may be implemented on a computer system similar to the computer system 500 described in FIG. 5. In various embodiments, computer system 500 may be a server, a mainframe computer system, a workstation, a network computer, a desktop computer, a laptop, or the like. While the present embodiments are not limited to any specific computing platform, or any specific computer configuration, one of ordinary skill will recognize that the system should include sufficient computational and processing power, as well as sufficient memory to accommodate many simultaneous calculations associated with the simulation performed as described herein.

For example, as illustrated, computer system 500 includes one or more processors 502A-N coupled to a system memory 504 via bus 506. Computer system 500 further includes network interface 508 coupled to bus 506, and input/output (I/O) controller(s) 510, coupled to devices such as cursor control device 512, keyboard 514, and display(s) 516. In some embodiments, a given entity (e.g., the PS-CAR simulation tool illustrated in FIG. 6) may be implemented using a single instance of computer system 500, while in other embodiments multiple such systems, or multiple nodes making up computer system 500, may be configured to host different portions or instances of embodiments (e.g., calibration unit 602 and PS-CAR simulation tool 604).

In various embodiments, computer system 500 may be a single-processor system including one processor 502A, or a multi-processor system including two or more processors 502A-N (e.g., two, four, eight, or another suitable number). Processor(s) 502A-N may be any processor capable of executing program instructions and executing quantitatively intensive calculations. For example, in various embodiments, processor(s) 502A-N may be general-purpose or embedded processors implementing any of a variety of instruction set architectures (ISAs), such as the x86, POWERPC®, ARM®, SPARC®, or MIPS® ISAs, or any other suitable ISA. In multi-processor systems, each of processor(s) 502A-N may commonly, but not necessarily, implement the same ISA. Also, in some embodiments, at least one processor(s) 502A-N may be a graphics processing unit (GPU) or other dedicated graphics-rendering device.

System memory 504 may be configured to store program instructions and/or data accessible by processor(s) 502A-N. For example, memory 504 may be used to store software program and/or database shown in FIGS. 7-10. In various embodiments, system memory 504 may be implemented using any suitable memory technology, such as static random access memory (SRAM), synchronous dynamic RAM (SDRAM), nonvolatile/Flash-type memory, or any other type of memory. As illustrated, program instructions and data implementing certain operations, such as, for example, those described above, may be stored within system memory 504 as program instructions 518 and data storage 520, respectively. In other embodiments, program instructions and/or data may be received, sent or stored upon different types of computer-accessible media or on similar media separate from system memory 504 or computer system 500. Generally speaking, a computer-accessible medium may include any tangible, non-transitory storage media or memory media such as electronic, magnetic, or optical media—e.g., disk or CD/DVD-ROM coupled to computer system 500 via bus 506, or non-volatile memory storage (e.g., "flash" memory)

In an embodiment, bus 506 may be configured to coordinate I/O traffic between processor 502, system memory 504, and any peripheral devices including network interface 508 or other peripheral interfaces, connected via I/O controller(s) 510. In some embodiments, bus 506 may perform any necessary protocol, timing or other data transformations to convert data signals from one component (e.g., system memory 504) into a format suitable for use by another component (e.g., processor(s) 502A-N). In some embodiments, bus 506 may include support for devices attached through various types of peripheral buses, such as a variant of the Peripheral Component Interconnect (PCI) bus standard or the Universal Serial Bus (USB) standard, for example. In some embodiments, the operations of bus 506 may be split into two or more separate components, such as a north bridge and a south bridge, for example. In addition, in some embodiments some or all of the operations of bus 506, such as an interface to system memory 504, may be incorporated directly into processor(s) 502A-N.

Figure 6:
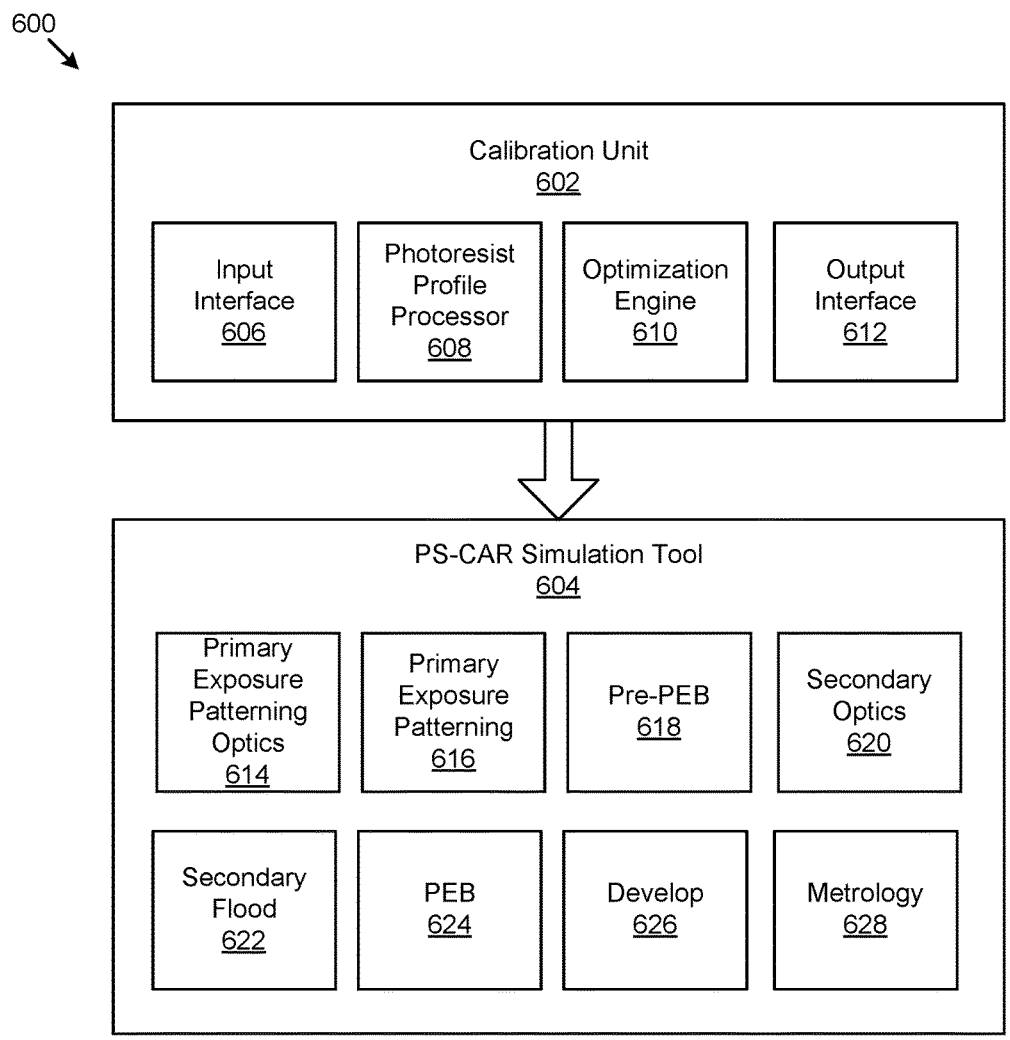
FIG. 6 is a schematic block diagram illustrating one embodiment of a system for PS-CAR photoresist simulation.

Network interface 508 may be configured to allow data to be exchanged between computer system 500 and other devices, such as other computer systems attached to the PS-CAR simulation tool as shown in FIG. 6, for example. In various embodiments, network interface 508 may support communication via wired or wireless general data networks, such as any suitable type of Ethernet network, for example; via telecommunications/telephony networks such as analog voice networks or digital fiber communications networks; via storage area networks such as Fiber Channel SANs, or via any other suitable type of network and/or protocol.

I/O controller(s) 510 may, in some embodiments, enable connection to one or more display terminals, keyboards, keypads, touch screens, scanning devices, voice or optical recognition devices, or any other devices suitable for entering or retrieving data by one or more computer system 500. Multiple input/output devices may be present in computer system 500 or may be distributed on various nodes of computer system 500. In some embodiments, similar I/O devices may be separate from computer system 500 and may interact with computer system 500 through a wired or wireless connection, such as over network interface 508.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

As shown in FIG. 5, memory 504 may include program instructions 518, configured to implement certain embodiments described herein, and data storage 520, comprising various data accessible by program instructions 518. In an embodiment, program instructions 518 may include software elements of embodiments illustrated in FIG. 6. For example, program instructions 518 may be implemented in various embodiments using any desired programming language, scripting language, or combination of programming languages and/or scripting languages. Data storage 520 may include data that may be used in these embodiments such as, for example, input parameters, mid-stream calculation values, or output parameters, as illustrated in FIGS. 11-20. In other embodiments, other or different software elements and data may be included.

A person of ordinary skill in the art will appreciate that computer system 500 is merely illustrative and is not intended to limit the scope of the disclosure described herein. In particular, the computer system and devices may include any combination of hardware or software that can perform the indicated operations. In addition, the operations performed by the illustrated components may, in some embodiments, be performed by fewer components or distributed across additional components. Similarly, in other embodiments, the operations of some of the illustrated components may not be performed and/or other additional operations may be available. Accordingly, systems and methods described herein may be implemented or executed with other computer system configurations.

FIG. 6 is a schematic block diagram illustrating one embodiment of a system 600 for PS-CAR photoresist simulation. In an embodiment, the system 600 includes a calibration unit 602 and a PS-CAR simulation tool 604. The calibration unit 602 may generate one or more input parameters specific to the PS-CAR chemistry to be modeled by the PS-CAR simulation tool 604. In an embodiment, the calibration unit 602 may be configured to perform operations associated with one or more of the embodiments of a method described in FIGS. 7-8.

The PS-CAR simulation tool 604 may receive the input parameters generated by the calibration unit, and other input parameters specific to the PS-CAR photoresist to be used, the system and processing parameters, as well as the specific features to be patterned. In response to the received inputs, the PS-CAR simulation tool 604 may compute a numerical model that is representative of the PS-CAR processing methods to be used, for example, by the system 100 described in FIG. 1. In general, the PS-CAR simulation tool 604 may be configured to carry out operations described in the methods of FIGS. 9-10. As described above, the various modules or units of the calibration unit 602 and the PS-CAR simulation tool may be software-defined modules stored in a memory device and configured to be executed by one or more processing devices, such as those illustrated in FIG. 5.

In an embodiment, the input interface 606 may be configured to receive input parameters, and other controls and commands for generating optimized inputs for the PS-CAR simulation tool 604. Examples of inputs may include optical parameters of the photoresist, such as refractive index, Dill A, and Dill B parameters, etc. Additional input parameters may include acid generation and bake parameters, such as, Dill C, quencher loading, amplification parameters, acid/base quench parameters, and acid/base diffusion parameters. Further, develop parameters may be received, including for example, development rate (Rmax/Rmin) parameters, etc. One of ordinary skill will recognize that the inputs may be initial conditions for these, and other parameters. Alternatively, inputs received by the input interface 606 may include feedback from physical measurements of verification experiments, and the like.

In an embodiment, the photoresist profile processor 608 may calculate an estimate of the physical features of the photoresist layer in response to the received inputs. For example, the photoresist profile processor may calculate a model of photoresist layer thicknesses, pattern features, such as edge sharpness, shot noise, etc., thickness lost, and the like. Further, the photoresist profile processor 608 may determine a number acid generators, quenchers (photodecomposable quenchers or more traditional non photodecomposable quenchers), precursors (photosensitizer generators), and photosensitizers within a photoresist volume.

The photoresist profile processor 608 may be further configured to perform one or more of the following operations: determine a number of acid induced de-protection reactions of the precursor to convert it to photosensitizer, determine the number of photons of primary exposure or secondary mid-UV flood absorbed by the photoresist volume, determine the number of the acid generators converted to acid by primary exposure or by photosensitizer activation by secondary mid-UV exposure wavelength, or range of wavelengths, and subsequent acid generator decomposition by excited photosensitizer, determine the number of the photo-decomposable quenchers (if applicable) decomposed by primary exposure or by secondary mid-UV exposure wavelength, or range of wavelengths, determine a number of acid and quencher neutralization reactions within the photoresist volume, determine the number of acid induced de-protection reactions of the protected polymer, calculate a development of the photoresist volume, produce with the processor a two-dimensional (or three-dimensional) image of the photoresist profile created by the development of the photoresist volume, and determine the dimensional properties of the photoresist profile. One of ordinary skill will recognize that these are merely a selection of the calculations which may be performed by the photoresist profile processor 608.

In an embodiment, the parameters calculated by the photoresist profile processor 608 may be provided to the PS-CAR simulation tool 604 via the output interface 612. In another embodiment, the output interface 612 may provide a readout, or printout of the calculated parameters for experimental verification. In response, engineers or scientists may experimentally verify the calculated parameters by conducting an actual lithography process with the selected PS-CAR chemistry according to the processing parameters, including exposure wavelength and dosing time, photoresist deposition rate, wafer turn rate, PEB specifications, etc. The actual dimensions of the experimentally developed wafer are then physically measured and compared with the model results. The differences between the modeled and actual results are provided to the input interface 606 as feedback for the optimization engine 610.

The optimization engine 610 may use one or more optimization algorithms, such as a gradient approach algorithm, a simplex algorithm, a semi-stochastic simulated annealing algorithm, a genetic algorithm, or others to modify the input parameters in order to reduce or eliminate error between the modeled results and the actual experimental results. In general, the error feedback will be assigned a numerical value, which may have a directional sign, for pulling or pushing the input parameters toward values that generate a global minimum of error between the modeled and actual results.

Figure 8:
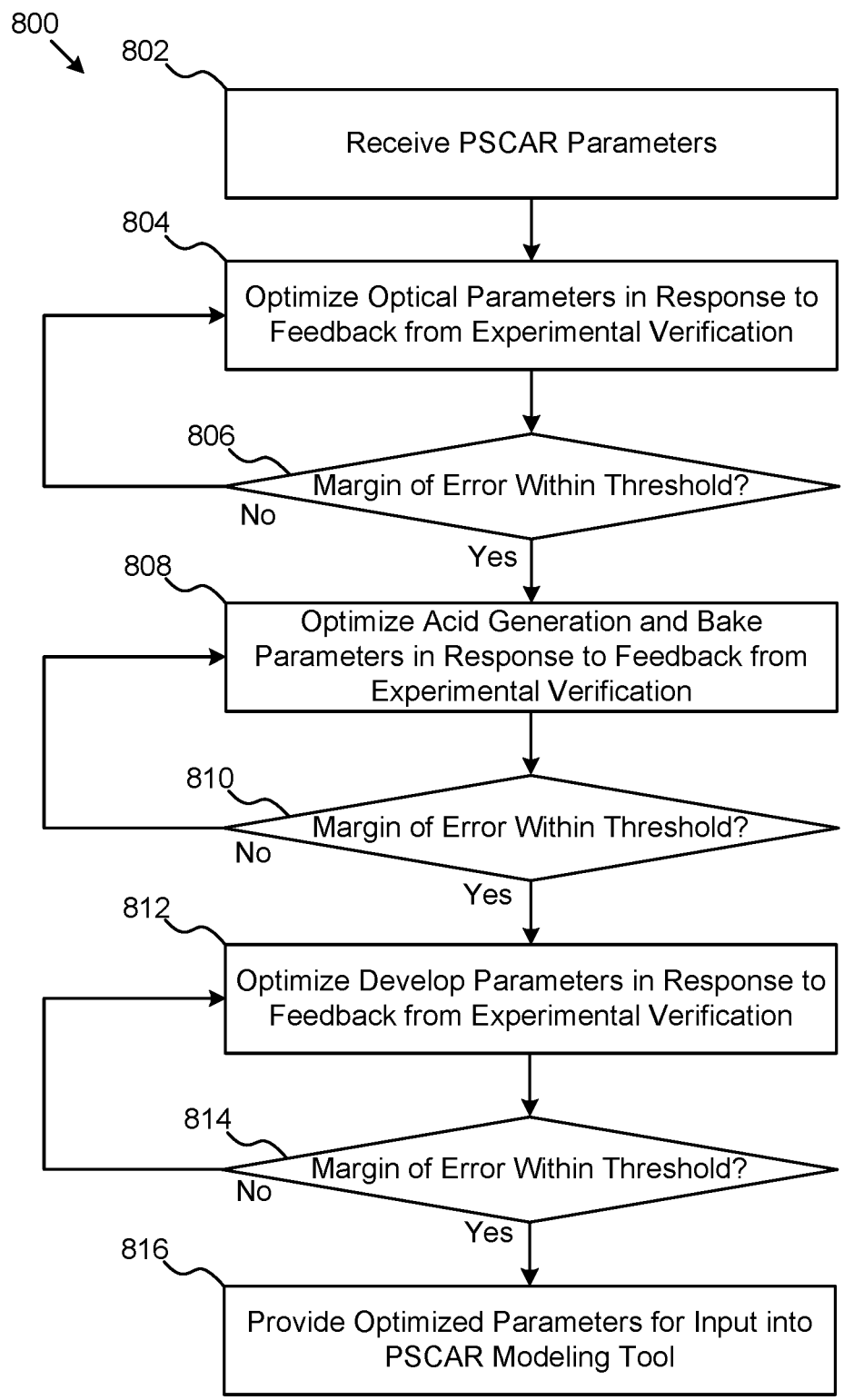
FIG. 8 is a schematic flowchart diagram illustrating one embodiment of a method for calibrating input parameters of a PS-CAR photoresist model.

In some embodiments, the optimization engine 610 may optimize PS-CAR optical parameters as described above. Further, the optimization engine 610 may optimize acid generation and bake parameters. In still a further embodiment, the optimization engine 610 may optimize develop parameters. In some embodiments, these three categories of parameters may be optimized independently and in series. Alternatively, the categories may be optimized independently and in parallel. Alternatively, the categories may be optimized dependently and in series, or dependently and in parallel. Examples of these optimization techniques are illustrated in FIG. 8.

Once the difference between the actual photoresist features and the modeled features reaches a threshold value, the optimization engine 610 may terminate the optimization process and the optimized parameters may be provided to the PS-CAR simulation tool 604 via the output interface 612. One of ordinary skill will recognize that the input interface 606 and the output interface may be hardware-based input/output interfaces. Alternatively, the input interface 606 and the output interface 612 may be software-defined, and the inputs and outputs may be passed between functions or modules of the software as function call parameters or function return values.

In addition to the calibrated parameters provided by the calibration unit 602, the PS-CAR simulation tool 604 may receive one or more process-specific parameters for an actual process to be modeled. The PS-CAR simulation tool 604 may include a plurality of modules or units, each unit configured to perform a portion of the model calculations associated with a processing step. The units may include an primary exposure patterning optics unit 614, an primary exposure patterning unit 616, a pre-PEB unit 618, a secondary exposure patterning unit 620, a secondary exposure unit 622, a PEB unit 624, a develop unit 626, and a metrology unit 628. The modules may execute a continuum model. Alternatively, the modules may execute a partially stochastic model. One of ordinary skill will recognize alternative embodiments.

Figure 14:
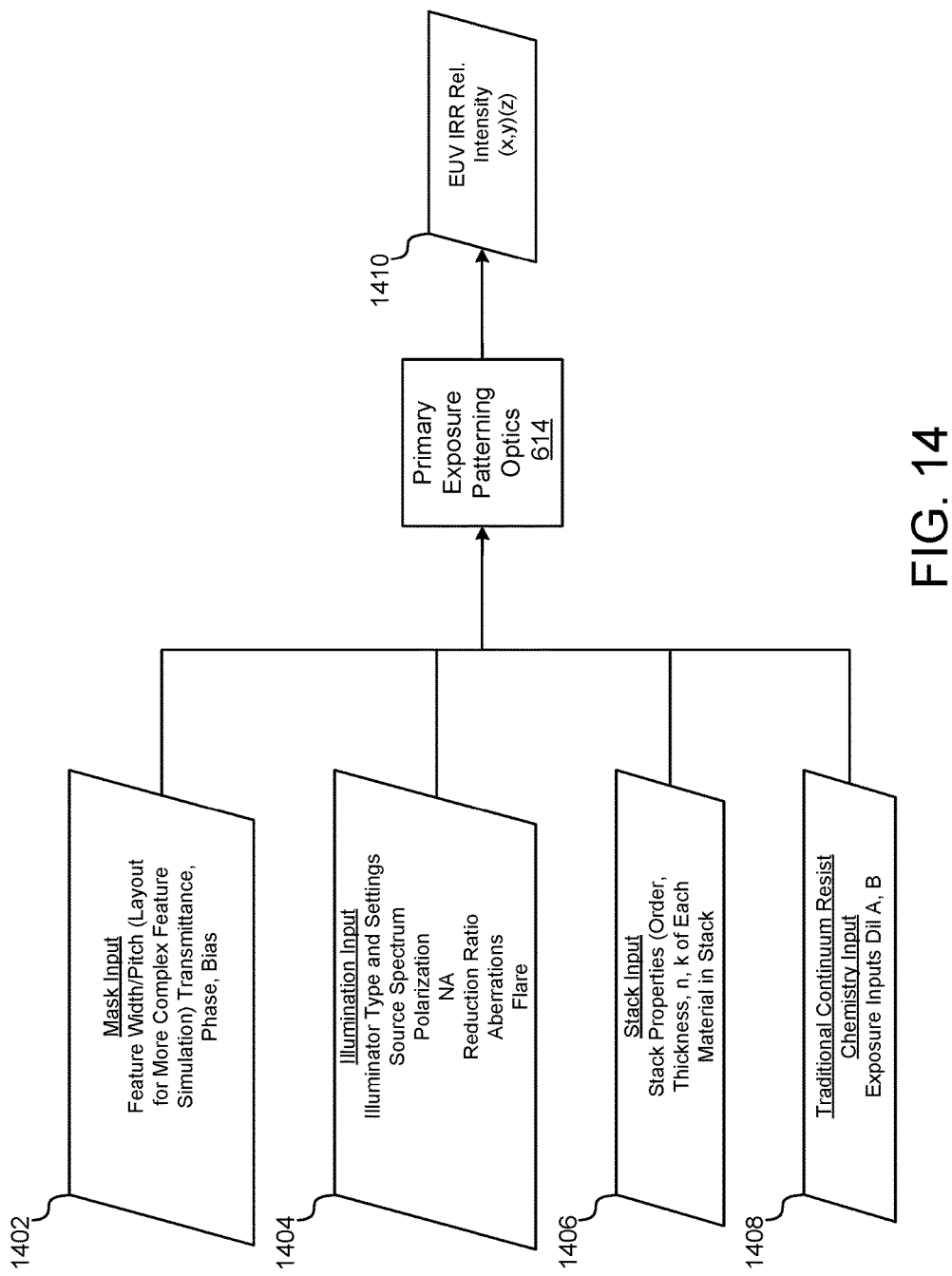
FIG. 14 is a schematic parameter architecture diagram illustrating operation of one embodiment of a EUV Optics module of a PS-CAR photoresist model.

In an embodiment, the primary exposure patterning optics unit 614 may include a simulated EUV source. The simulator may simulate a commercially available optical source used for patterning the PS-CAR photoresist layer. Additional parameters may include intensity, focus length, etc. Further details of the primary exposure patterning optics unit 614 are illustrated in FIG. 14.

Figure 15:
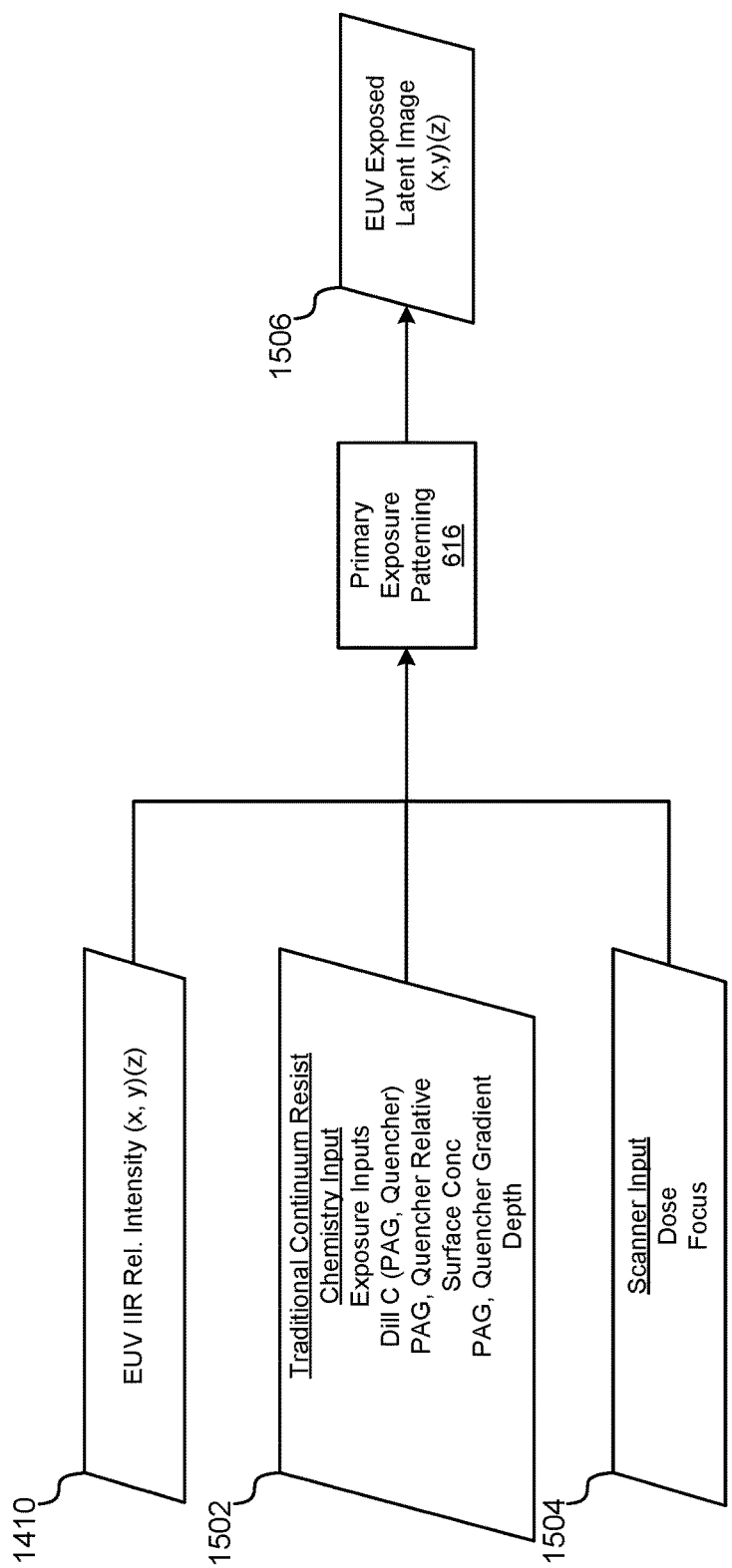
FIG. 15 is a schematic parameter architecture diagram illustrating operation of one embodiment of a EUV exposure module of a PS-CAR photoresist model.

In an embodiment, the EUV unit 616 is configured to model the response in the PS-CAR photoresist layer in response to EUV exposure from the simulated EUV source. Modeled parameters may include one or more of: exposure time/dose, mask feature sizes, stepper/scanner settings, focus, polarization, etc. Further details of the primary exposure patterning unit 616 are illustrated in FIG. 15.

Figure 16:
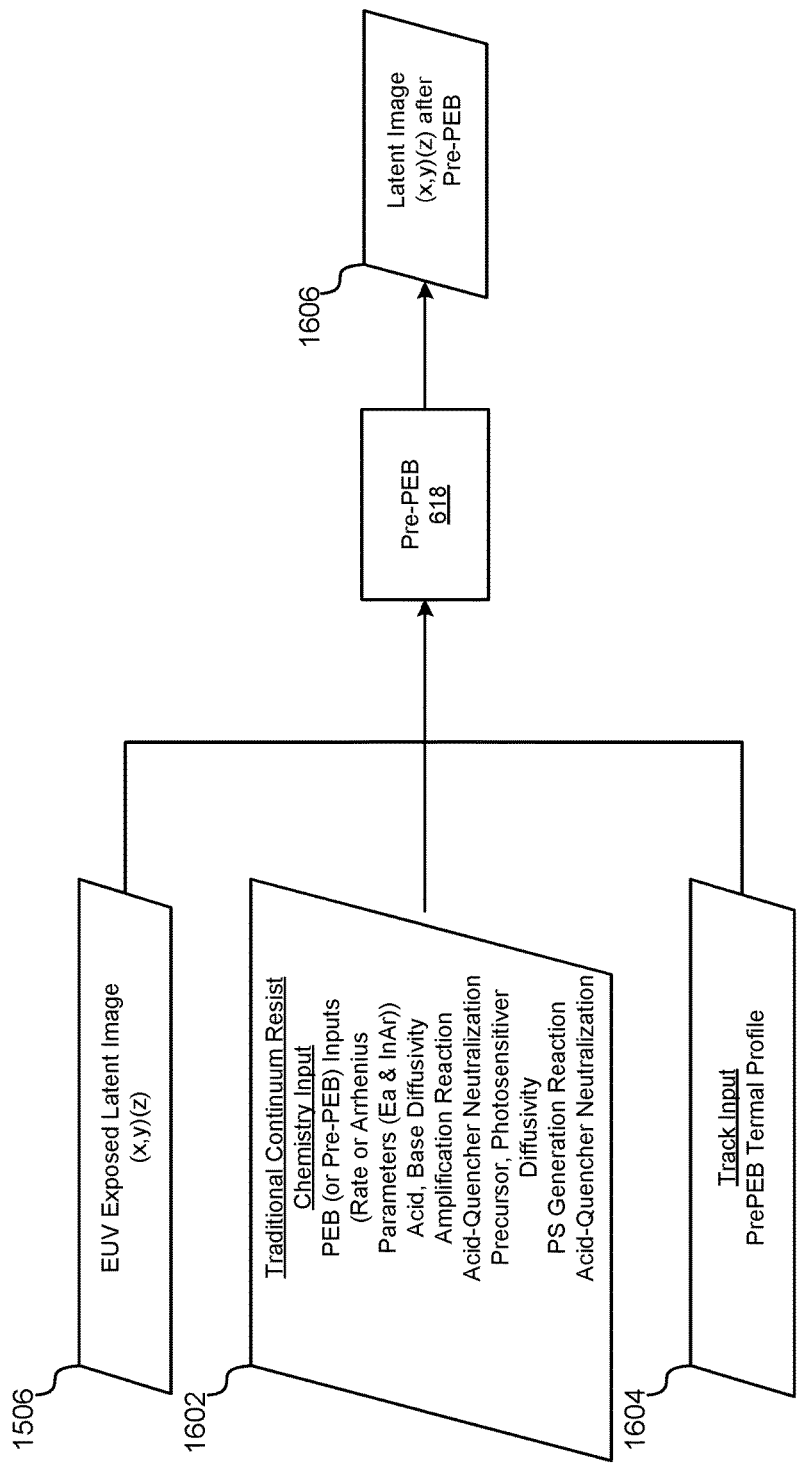
FIG. 16 is a schematic parameter architecture diagram illustrating operation of one embodiment of a pre-PEB module of a PS-CAR photoresist model.

In an embodiment, the Pre-PEB unit 618 may model the results of a pre-PEB photosensitizer diffusion process. The pre-PEB unit 618 may be optional in some embodiments, or at least selectably employed in response to a pre-PEB diffusion period. Further details of the pre-PEB unit 618 are illustrated in FIG. 16.

Figure 17:
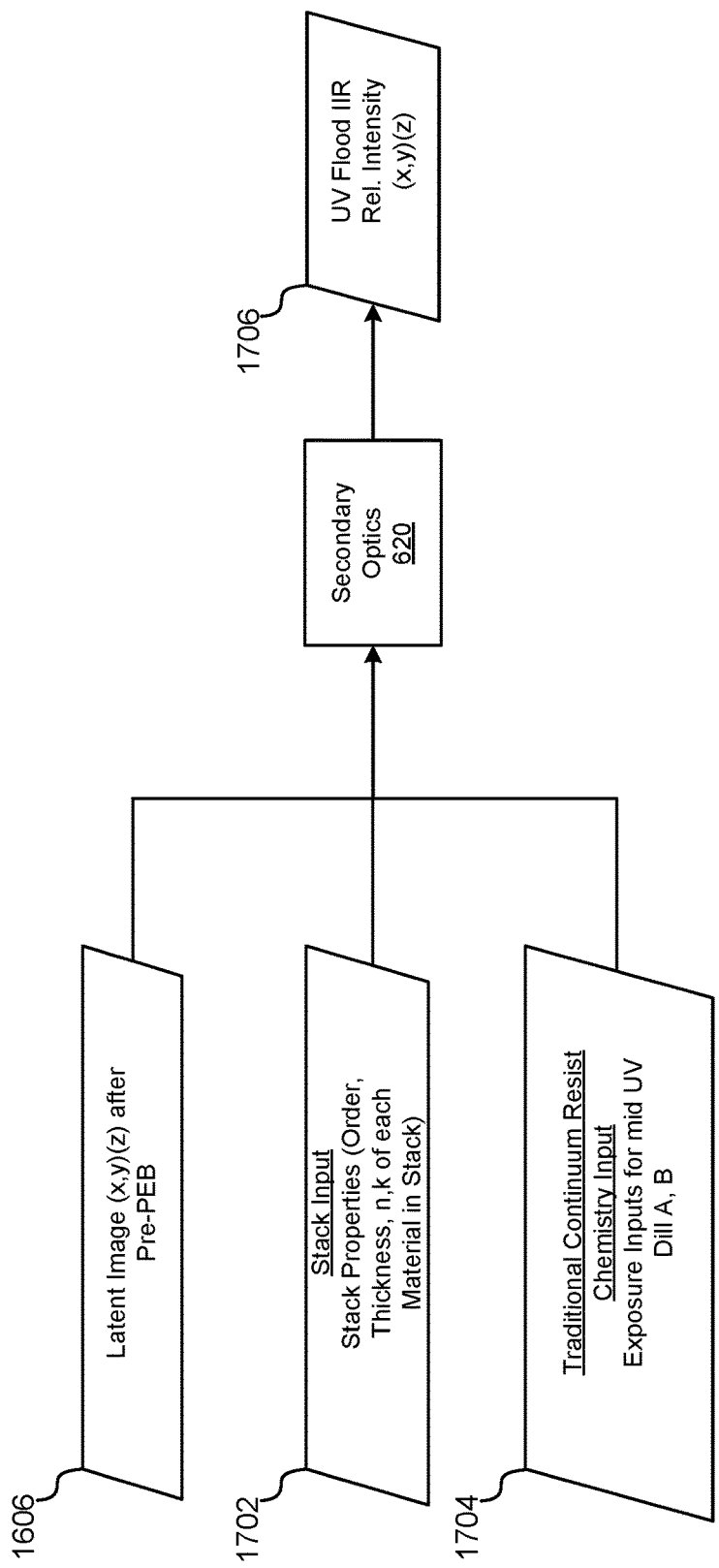
FIG. 17 is a schematic parameter architecture diagram illustrating operation of one embodiment of a UV optics simulator of a PS-CAR photoresist model.
Figure 18:
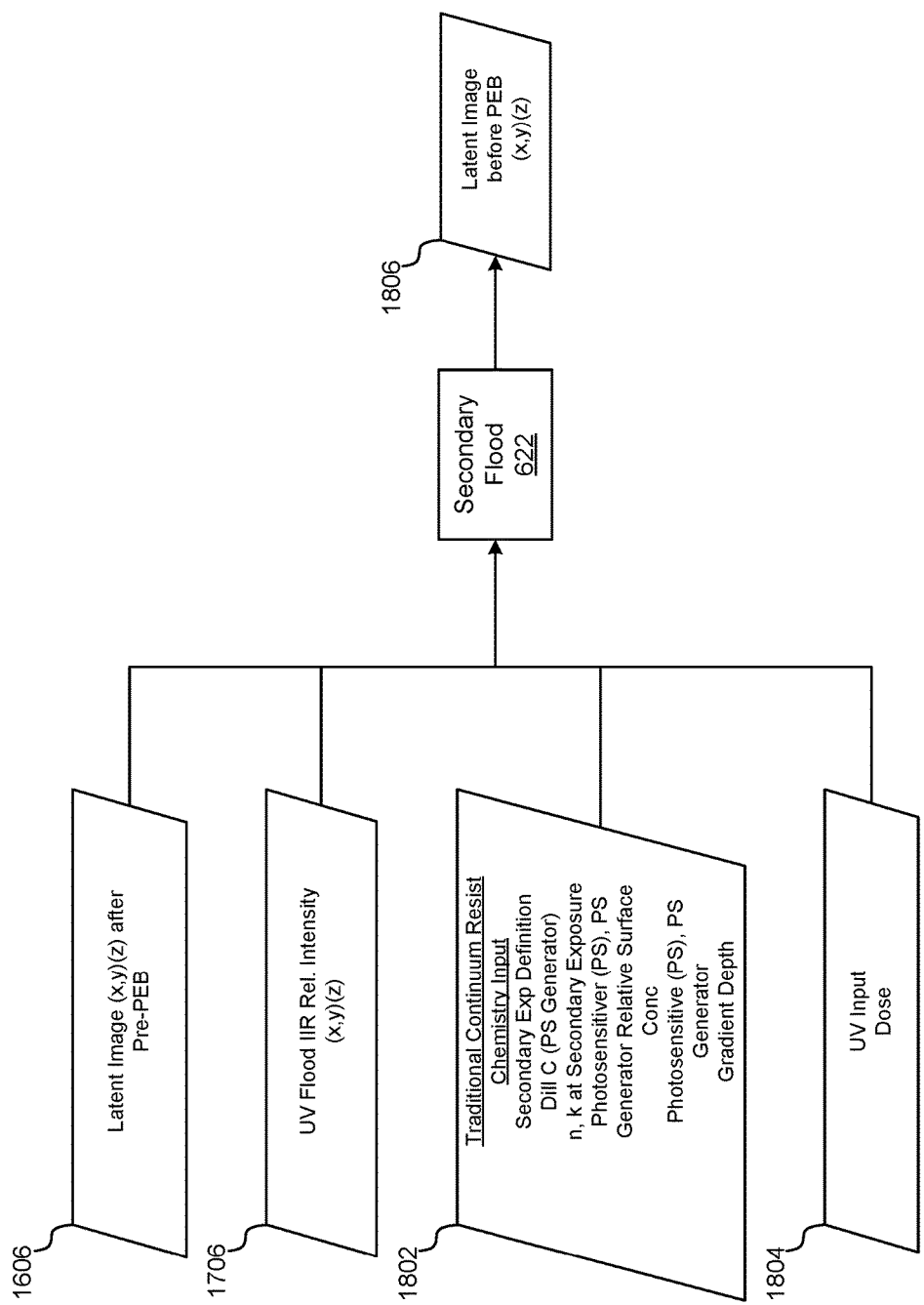
FIG. 18 is a schematic parameter architecture diagram illustrating operation of one embodiment of a UV flood exposure module of a PS-CAR photoresist model.

In an embodiment, the secondary optics unit 620 may be configured to simulate a commercially available UV source. The secondary optics unit 620 may model the wavelength, intensity, illumination method, etc. The secondary optics unit 620 may be used by the UV flood unit 622 to model the physical results of the UV flood process on the PS-CAR photoresist layer. Further details of the secondary optics unit 620 and the UV flood unit 622 are illustrated in FIGS. 17-18 respectively.

In an embodiment, the PEB unit 624 may model the response of the photoresist to a post-exposure bake process. Modeled parameters may include bake temperature, bake time, bake humidity, etc. further details of the PEB unit 624 are described in FIG. 19.

Figure 20:
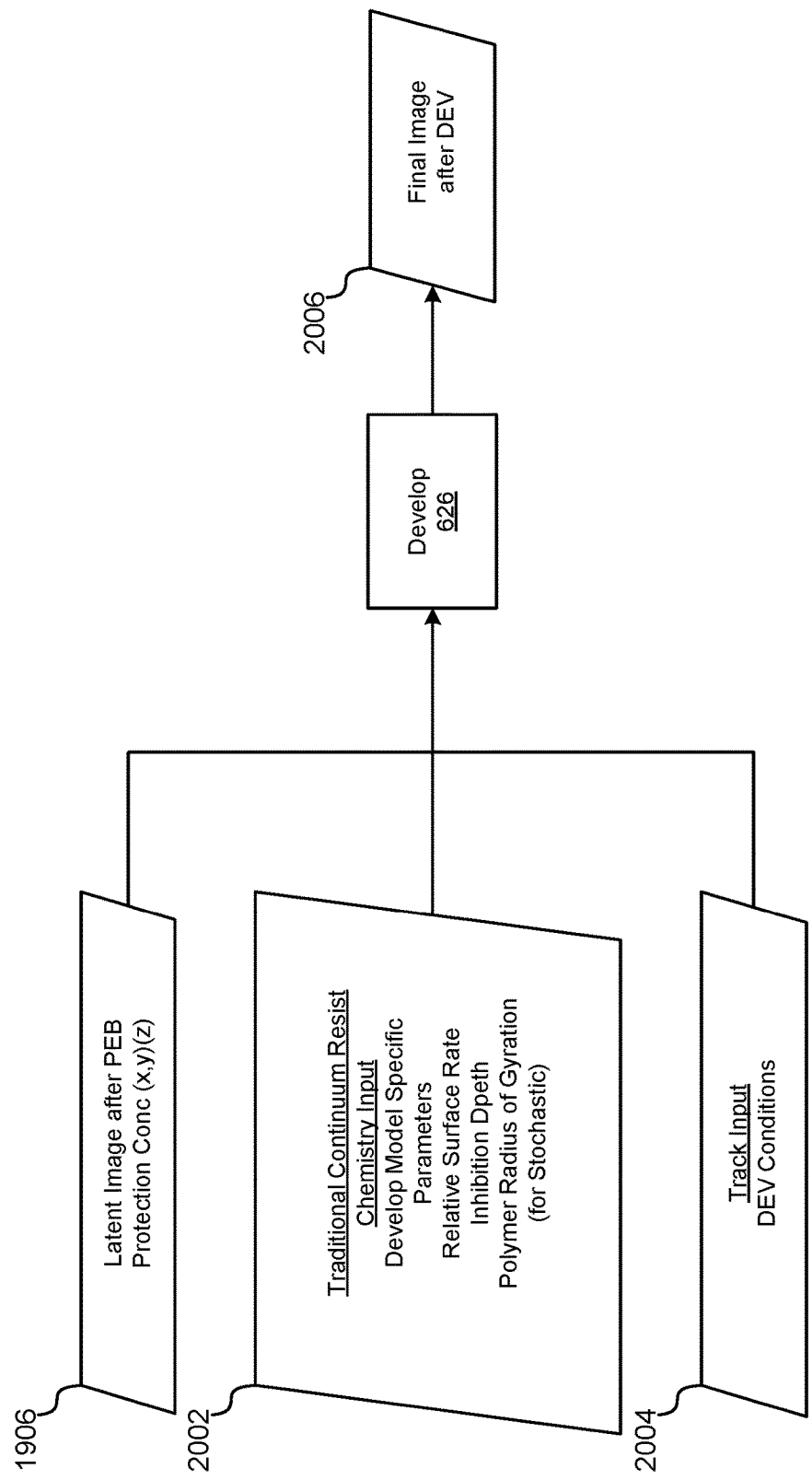
FIG. 20 is a schematic parameter architecture diagram illustrating operation of one embodiment of a developer module of a PS-CAR photoresist model.

In an embodiment, the develop unit 626 may be configured to model the response of the PS-CAR photoresist to a develop process. Modeled parameters may include relative surface rate, inhibition depth, and other develop conditions. Further details of the parameters modeled by the develop unit 626 are illustrated in FIG. 20.

Figure 21:
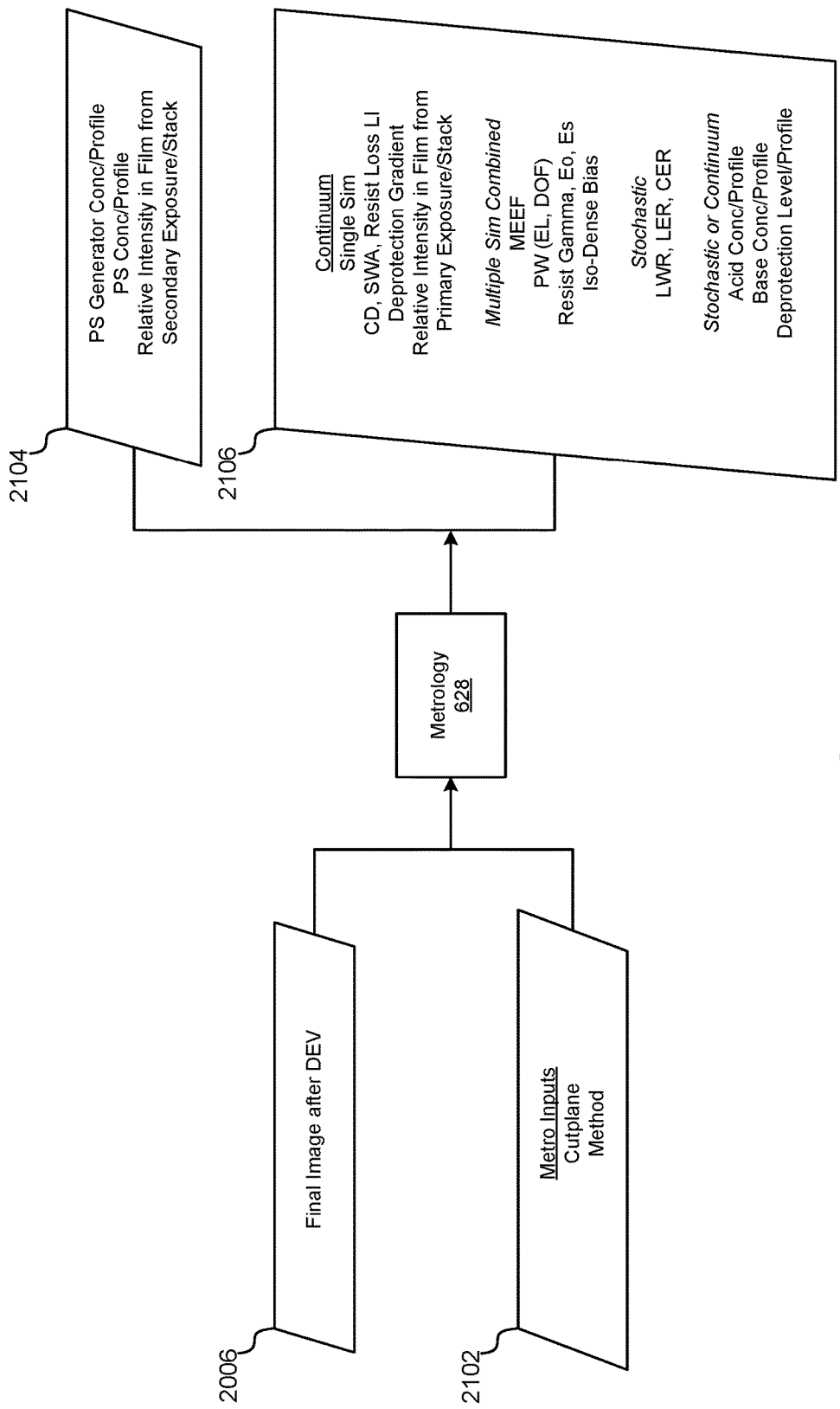
FIG. 21 is a schematic parameter architecture diagram illustrating operation of one embodiment of a metrology module of a PS-CAR photoresist model.

In an embodiment, the metrology unit 628 is configured to provide simulated measurement values of modeled features on the PS-CAR photoresist layer. The measurement values may include resist loss, deprotection levels and profiles, etc. In some embodiments, continuum model outputs may be provided. In alternative embodiments, stochastic model outputs may be provided. Further details of the parameters modeled by the metrology unit 628 are illustrated in FIG. 21.

Figure 7:
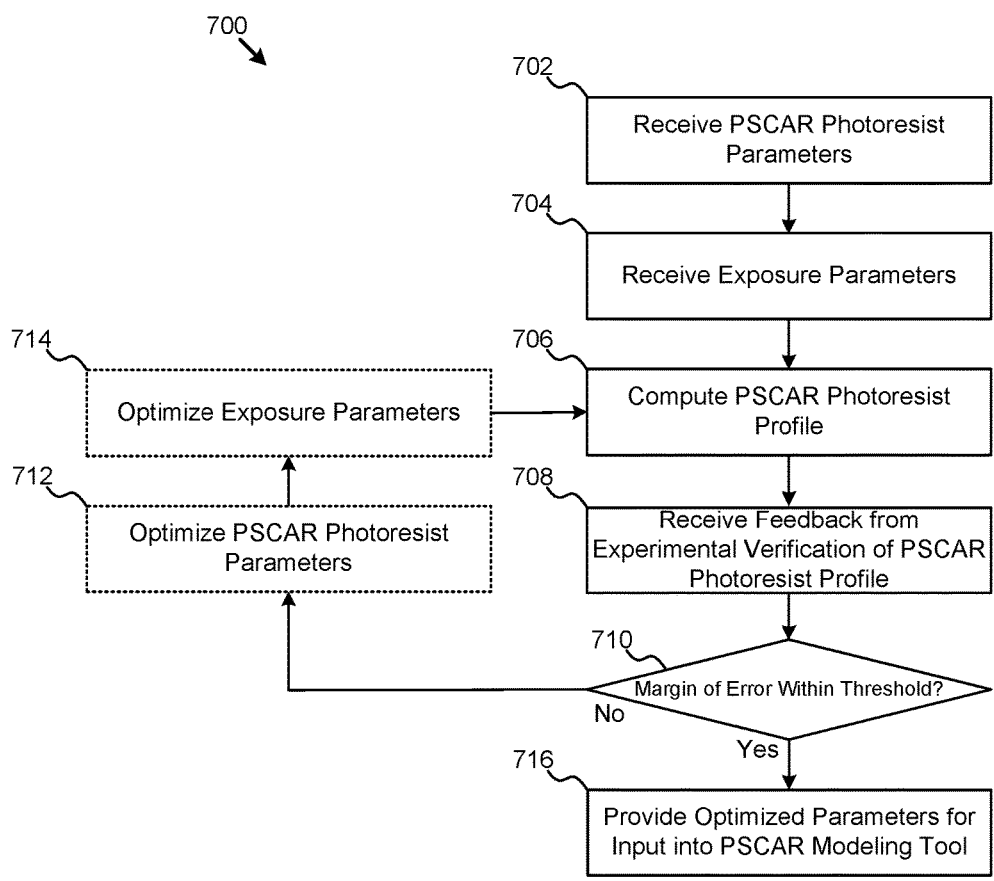
FIG. 7 is a schematic flowchart diagram illustrating one embodiment of a method for calibrating input parameters of a PS-CAR photoresist model.

FIG. 7 is a schematic flowchart diagram illustrating one embodiment of a method 700 for calibrating input parameters of a PS-CAR photoresist model. In an embodiment, the method 700 may include receiving one or more PS-CAR photoresist parameters at block 702. Exposure parameters may be received at block 704. The method 700 may include computing a PS-CAR photoresist profile in response to the received PS-CAR photoresist parameters and the received exposure parameters at block 706. At block 708, the method 700 may include receiving feedback from an experimental verification of the PS-CAR photoresist profile. If, at block 710, it is determined that the error is within a threshold margin, then the optimized parameters are provided as input into a PS-CAR simulation tool at block 716. If not, the PS-CAR photoresist parameters and the exposure parameters may optionally be optimized at blocks 712 and 714 respectively. The optimization loop may continue until the threshold is met at block 710.

Figure 9:
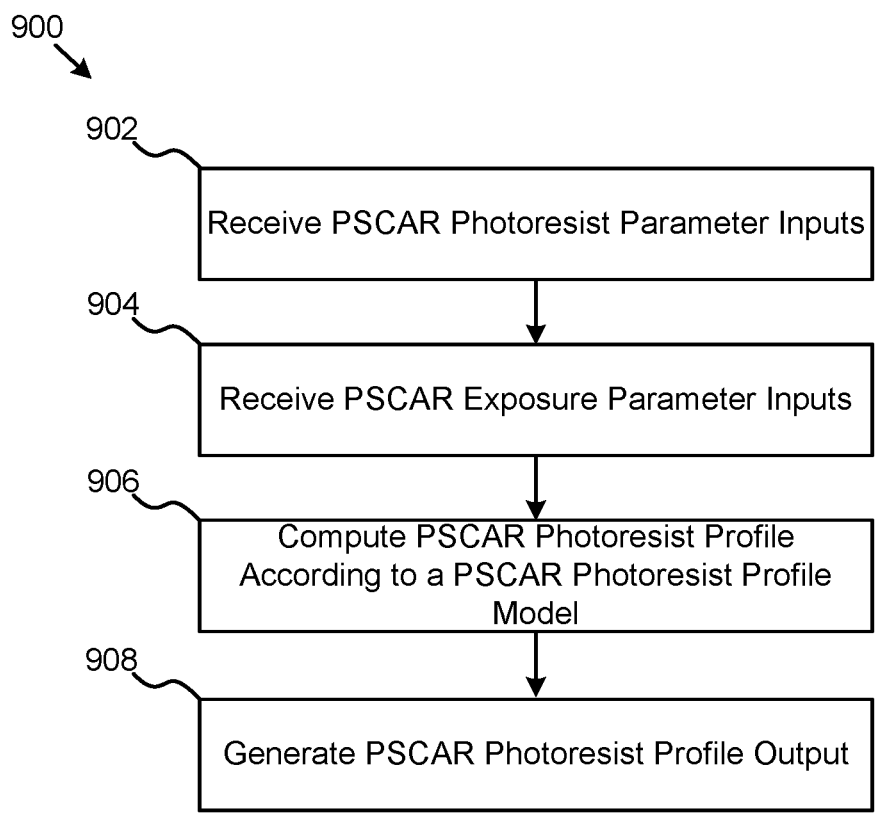
FIG. 9 is a schematic flowchart diagram illustrating one embodiment of a method for simulating PS-CAR photoresist.
Figure 10:
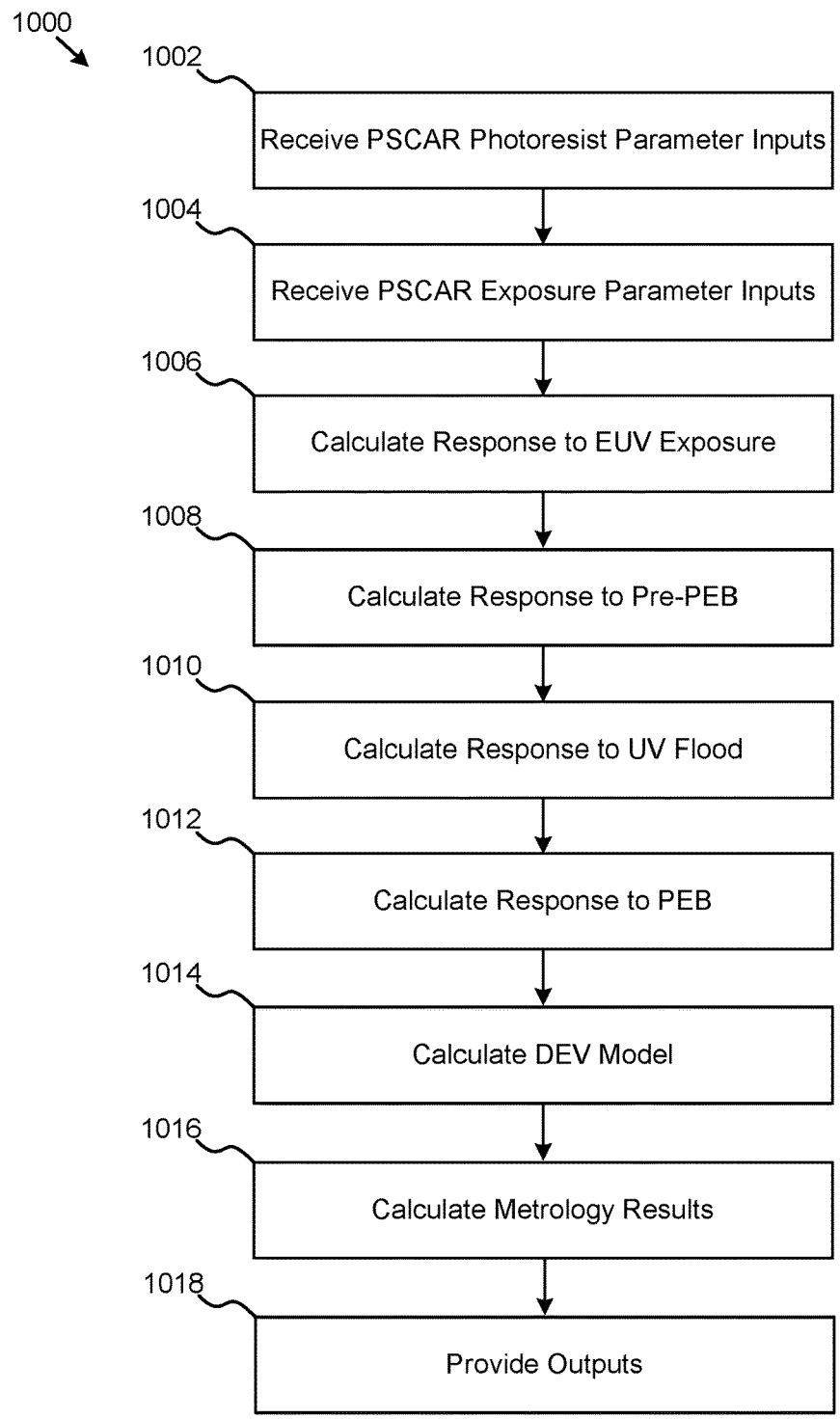
FIG. 10 is a schematic flowchart diagram illustrating one embodiment of a method for simulating PS-CAR photoresist.

The flowcharts illustrated in FIGS. 7-10 illustrate methods for calculating a PS-CAR photoresist profile. FIGS. 7-8 are directed to methods for calibrating model parameters, and FIGS. 9-10 are directed to methods for calculating a PS-CAR photoresist profile according to a PS-CAR photoresist model.

FIG. 8 is a schematic flowchart diagram illustrating one embodiment of a method 800 for calibrating input parameters of a PS-CAR photoresist model. In an embodiment, the method 800 includes receiving PS-CAR parameters at block 802. The optical parameters may be optimized in response to feedback from experimental verification at block 804 until the threshold is reached at block 806. The acid generation and bake parameters may be optimized in response to the feedback from experimental results at block 808 until the threshold is reached at block 810. Additionally, the develop parameters may be optimized in response to feedback from experimental verification at block 812 until the threshold is reached at block 814. Once the parameters have been optimized, they may be provided as input into the PS-CAR simulation tool at block 816.

FIG. 9 is a schematic flowchart diagram illustrating one embodiment of a method 900 for modeling PS-CAR photoresist. In an embodiment, the method 900 includes receiving PS-CAR photoresist parameter inputs at block 902 and receiving PS-CAR exposure parameters at block 904. The method 900 further includes computing a PS-CAR photoresist profile according to a PS-CAR photoresist profile model at block 906. At block 908, the method 900 includes generating a PS-CAR photoresist profile output, in response to the profile.

FIG. 10 is a schematic flowchart diagram illustrating one embodiment of a method 1000 for modeling PS-CAR photoresist. In an embodiment, the method 1000 includes receiving PS-CAR photoresist parameter inputs at block 1002 and receiving PS-CAR exposure parameter inputs at block 1004. At block 1006, the method may include calculating a response to EUV exposure. At block 1008, the method 1000 may include calculating a response to a Pre-PEB diffusion step. At block 1010, the method may include calculating a response to a UV flood. At block 1012, the method 1000 may include calculating a response to PEB. Block 1014 may include calculating a develop model. Block 1016 includes calculating metrology results. Block 1018 includes providing outputs in response to the values calculated in steps 1006-1016.

Figure 11:
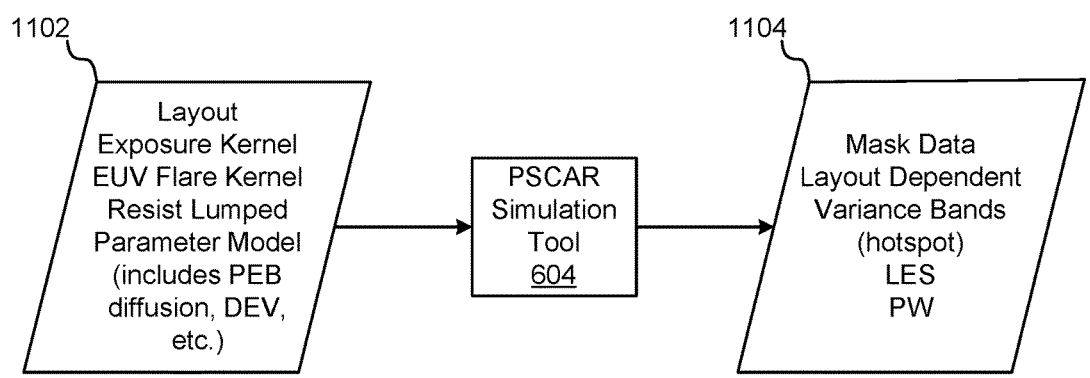
FIG. 11 is a schematic input/output diagram illustrating an embodiment of an input/output data set for a PS-CAR photoresist model.

FIG. 11 is a schematic input/output diagram illustrating an embodiment of an input/output data set for a PS-CAR photoresist model. In an embodiment, the model may be executed by a PS-CAR simulation tool 604. Examples on inputs 1102 may include a feature layout, an exposure kernel, and EUV flare kernel, a resist parameter model, etc. In an embodiment, some or all of the input parameters may be provided by the calibration unit 602. Examples of outputs 1104 include mask data, layout dependent variance bands, Line End Shortening (LES), and Process Window (PW).

Figure 12:
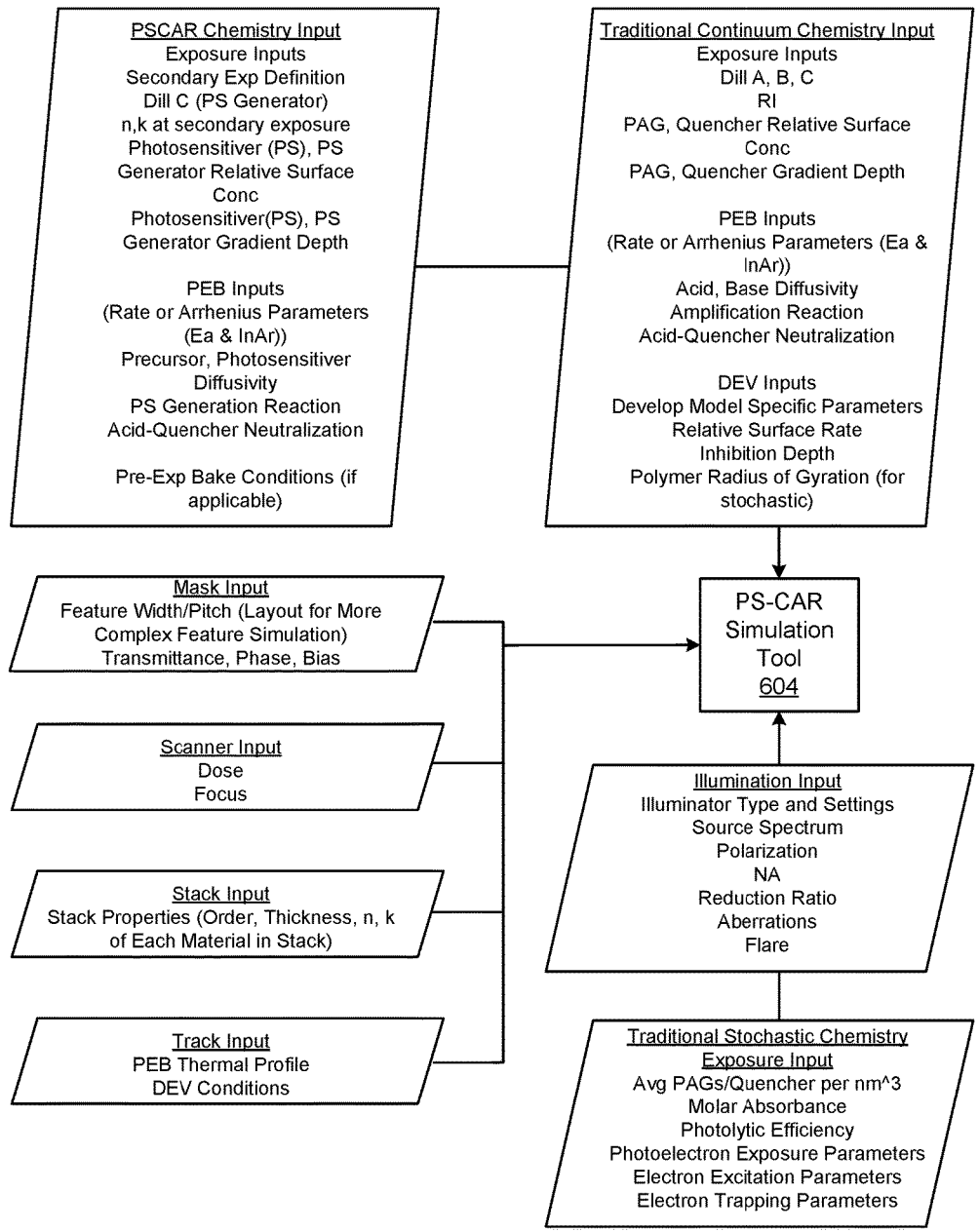
FIG. 12 is a schematic parameter architecture diagram illustrating one embodiment of an input data set for a PS-CAR photoresist model.

FIG. 12 is a schematic parameter architecture diagram illustrating one embodiment of an input data set for a PS-CAR photoresist simulator. In an embodiment, inputs may include PS-CAR chemistry inputs, exposure inputs, PEB inputs, etc. Examples of exposure inputs include a secondary exposure definition, Dill C parameters, n,k parameters at secondary (UV) exposure, PS generator gradient depth, and the like. Examples of PEB inputs include parameters for: precursor, photosensitivity, diffusivity, PS generation reaction, acid quencher and neutralization. In an embodiment, Pre-PEB parameters may also be provided. Additional inputs for continuum models and stochastic models may be provided, as well as illumination source parameters, etc.

Figure 13:
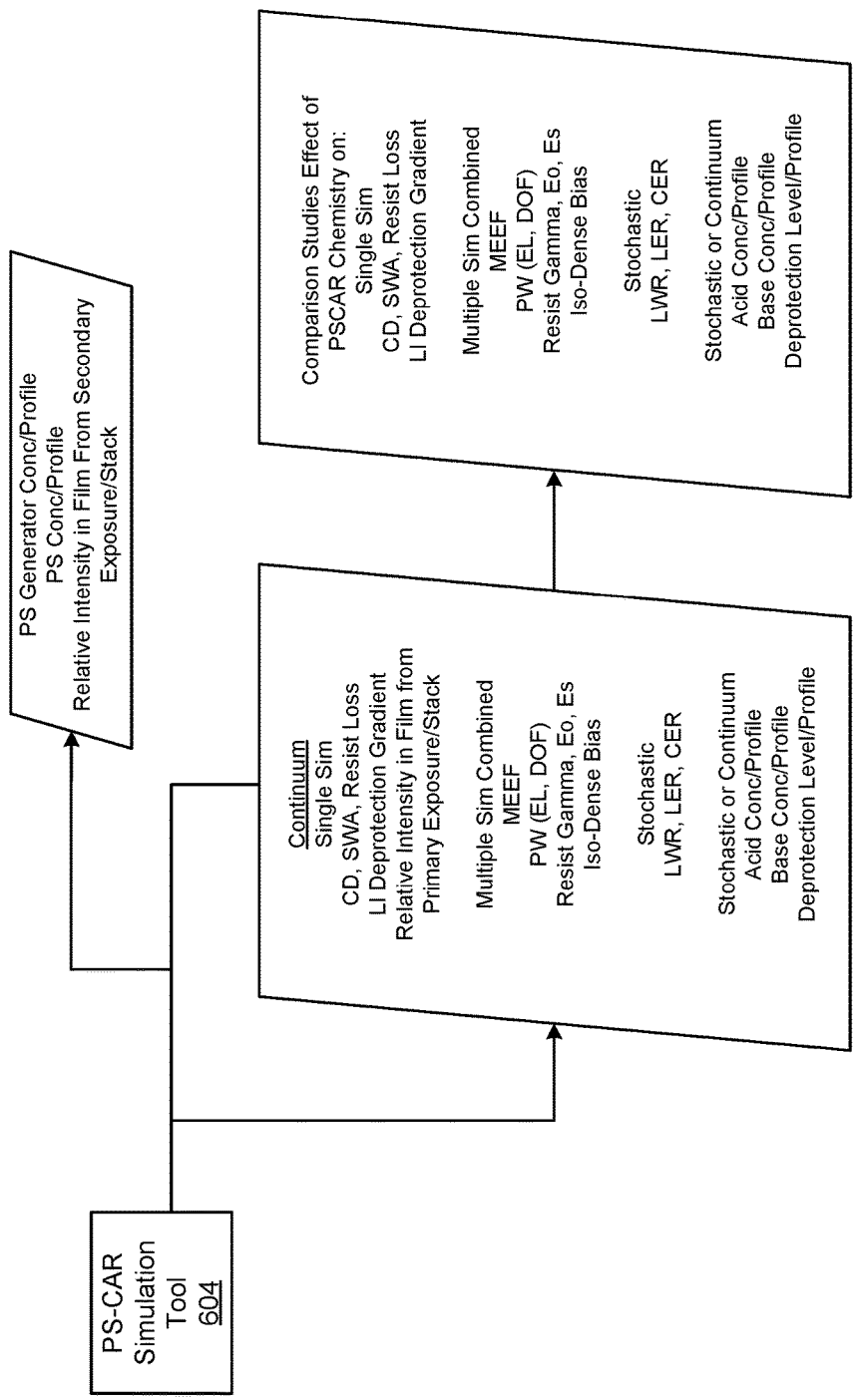
FIG. 13 is a schematic parameter architecture diagram illustrating one embodiment of an output data set for a PS-CAR photoresist model.

FIG. 13 is a schematic parameter architecture diagram illustrating one embodiment of an output data set for a PS-CAR photoresist model. In an embodiment, outputs may include a continuum model profile, stochastic model outputs, as well as PS-CAR photoresist-specific outputs related to PS generator profiles, and secondary exposure profiles. In a further embodiment, a comparative analysis may be provided indicating a comparison of the effect of PS-CAR chemistry vs. other methods.

FIG. 14 is a schematic parameter architecture diagram illustrating operation of one embodiment of a primary exposure patterning optics unit 614 of a PS-CAR photoresist model tool 604. In an embodiment, the primary exposure patterning optics unit 614 may include multiple sets of inputs, including mask input 1402, illumination input 1404, stack input 1406, and traditional continuum resist chemistry inputs 1408. The output 1410 may include an image, or data representing an image generated by the model, that shows EUV relative intensity in either a 2D plane or a 3D space.

FIG. 15 is a schematic parameter architecture diagram illustrating operation of one embodiment of a primary exposure patterning unit 616 of a PS-CAR photoresist modeling tool 604. In an embodiment, inputs to the module include the EUV relative intensity data 1410, which is the output of the primary exposure patterning optics unit 614. Additional inputs include continuum resist chemistry inputs 1502 and scanner inputs 1504. The EUV unit 616 may process the inputs to generate an EUV exposed latent image 1506, or dataset representative thereof.

FIG. 16 is a schematic parameter architecture diagram illustrating operation of one embodiment of a pre-PEB module 618 of a PS-CAR photoresist modeling tool 604. In an embodiment, inputs to the pre-PEB module 618 include the EUV exposed latent image 1506, which is the output of the primary exposure patterning unit 616. Additional inputs include continuum resist chemistry inputs 1602 and track inputs 1604. The Pre-PEB module 618 may process these inputs and generate a latent image after pre-PEB 1606, or data representative thereof.

FIG. 17 is a schematic parameter architecture diagram illustrating operation of one embodiment of a secondary optics unit 620 of a PS-CAR photoresist simulation tool 604. In an embodiment, inputs to the secondary optics unit 620 include the latent image after pre-PEB 1606, which is the output of the pre-PEB module 618. Additional inputs may include stack inputs 1702 and continuum resist chemistry inputs 1704. The secondary optics unit 620 may process these inputs and generate a UV flood relative intensity image 1706, or data representative thereof.

FIG. 18 is a schematic parameter architecture diagram illustrating operation of one embodiment of a secondary flood unit 622 of a PS-CAR photoresist simulation tool 604. In an embodiment, inputs to the secondary flood unit 622 include the latent image after pre-PEB 1606, which is the output of the pre-PEB module 618, as well as the UV flood relative intensity image 1706, which is the output of the secondary optics unit 620. Additional inputs may include continuum resist chemistry inputs 1802 UV inputs 1804, etc. The secondary flood unit 622 may generate a latent image before PEB 1806 in response to these inputs.

Figure 19:
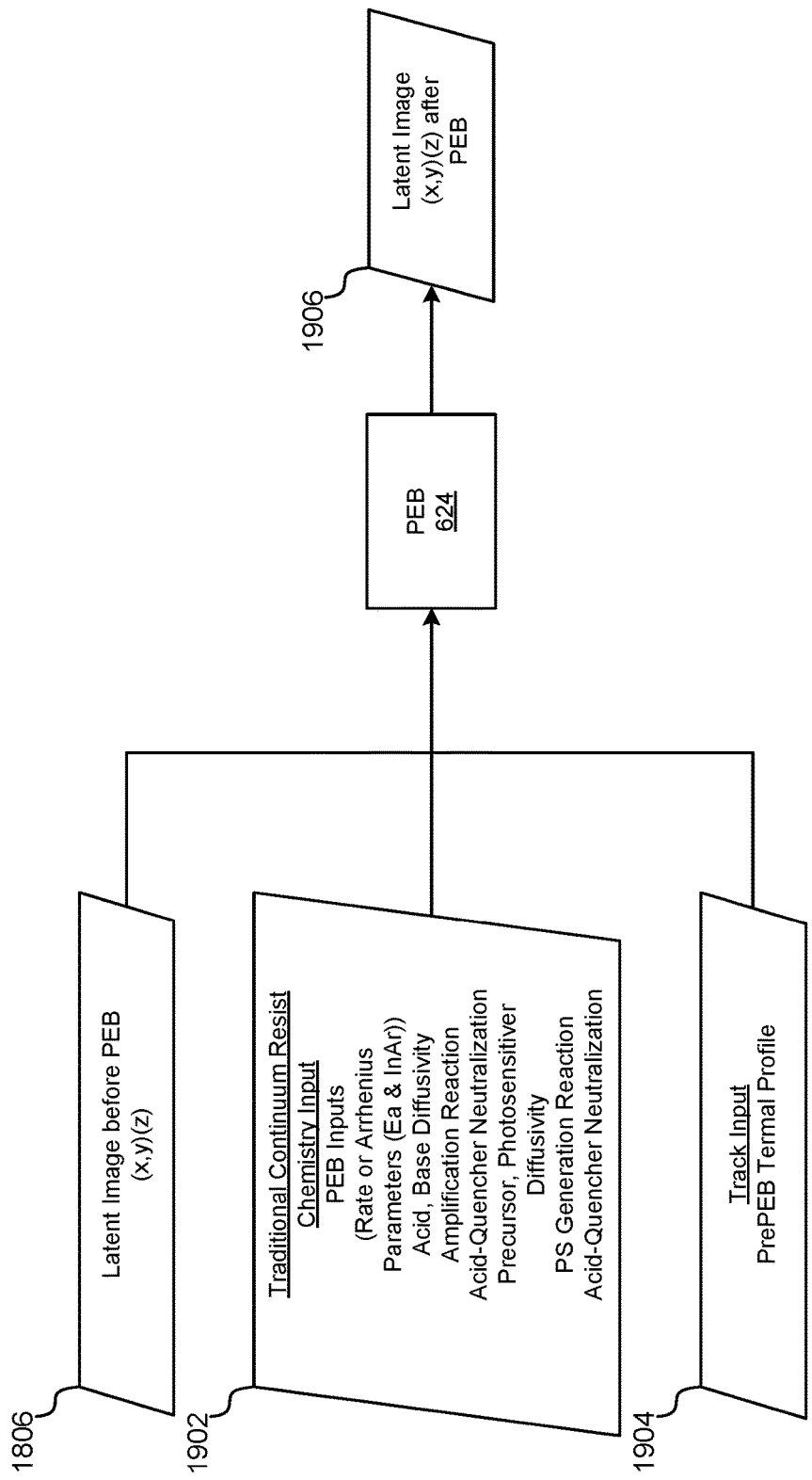
FIG. 19 is a schematic parameter architecture diagram illustrating operation of one embodiment of a PEB module of a PS-CAR photoresist model.

FIG. 19 is a schematic parameter architecture diagram illustrating operation of one embodiment of a PEB module 624 of a PS-CAR photoresist simulation tool 604. In an embodiment, inputs to the PEB module 624 include the latent image before PEB 1806 generated by the secondary flood unit 622. Additional inputs may include continuum resist chemistry inputs 1902 and track inputs 1904. The PEB module 624 may generate a latent image after PEB 1906 in response to these inputs.

FIG. 20 is a schematic parameter architecture diagram illustrating operation of one embodiment of a developer module 626 of a PS-CAR photoresist simulation tool 604. In an embodiment, inputs to the develop module 626 include the latent image after PEB 1906. Additional inputs may include the continuum resist chemistry inputs 2002 and track inputs 2004. In response to these inputs, the develop module 626 may generate a final image after develop 2006.

FIG. 21 is a schematic parameter architecture diagram illustrating operation of one embodiment of a metrology module 628 of a PS-CAR photoresist simulation tool 604. In an embodiment, inputs to the metrology module 628 may include the final image after develop 2006 generated by the develop module 626. Additional inputs may include metrology inputs 2102. In response to these inputs, the metrology module 628 may generate PS generator parameter outputs 2104 and additional profile outputs 2106, including continuum parameters and stochastic parameters.

One of ordinary skill will recognize that the inputs and outputs described with relation to FIGS. 14-21 are merely representative of the types of inputs and outputs that may be processed by the various modules of the PS-CAR photoresist simulation tool 604. Various alternative embodiments exist in which certain inputs or outputs are added, omitted, or modified according to model design requirements. Further, one of ordinary skill will recognize that the model may be configured to handle actual images as inputs and outputs, or alternatively, datasets. In certain embodiments, datasets may be representative of features found in an image, or the image itself.

Persons skilled in the relevant art can appreciate that many modifications and variations are possible in light of the above teaching. Persons skilled in the art will recognize various equivalent combinations and substitutions for various components shown in the figures. It is therefore intended that the scope of the invention be limited not by this detailed description, but rather by the claims appended hereto.

What we claim:

1. A method for calibrating a model of a simulated lithography process, the method comprising:
    receiving, at an input interface, a plurality of process parameters for a radiation-sensitive material for use in the lithography process, wherein the radiation-sensitive material is a Photo-Sensitized Chemically-Amplified Resist (PS-CAR) material comprising:
        a first light wavelength activation threshold that controls the generation of acid to a first acid concentration in the PS-CAR material and controls generation of photosensitizer (PS) molecules in the PS-CAR material; and
        a second light wavelength activation threshold that can excite the PS molecules in the PS-CAR material that results in the acid comprising a second acid concentration that is greater than the first acid concentration, the second light wavelength being different from the first light wavelength, and
    wherein the plurality of process parameters include a physical parameter specific to the PS-CAR material chemistry,
    a first radiation exposure parameter associated with a first radiation exposure step according to the first light wavelength activation threshold, and a second radiation exposure parameter associated with a second radiation exposure step according to the second light wavelength activation threshold;
    calculating, using a data processor, a profile of the radiation-sensitive material according to a lithography process model, and in response to the physical parameter and the first and second radiation exposure parameters;
    receiving, at the input interface, feedback indicative of an error value corresponding to a comparison of the profile of the radiation-sensitive material and an experimental verification of the model;
    optimizing, using the data processor, the physical parameter and the first and second radiation exposure parameters in response to the feedback; and
    generating an output, at an output interface, comprising the optimized physical parameter and the optimized first and second radiation exposure parameters in response to a determination that the error value is within a threshold margin of error.

2. The method of claim 1, wherein the first radiation exposure parameter is associated with a first radiation source configured to emit radiation at the first light wavelength and the second radiation exposure parameter is associated with a second radiation source configured to emit radiation at the second light wavelength.

3. The method of claim 1, further comprising optimizing an optical parameter in response to the feedback.

4. The method of claim 1, further comprising optimizing one or more of an acid generation parameter and a bake parameter in response to the feedback.

5. The method of claim 1, further comprising optimizing a development parameter in response to the feedback.

6. The method of claim 1, wherein calculating the profile of the radiation-sensitive material includes determining a number of acid generators, a number of photo-decomposable quenchers, a number of photosensitizer generators, and a number of photosensitizers within a volume of the radiation-sensitive material.

7. The method of claim 6, wherein calculating the profile of the radiation-sensitive material includes determining a number of acid induced de-protection reactions of the precursor generators to convert them to photosensitizer.

8. The method of claim 6, wherein calculating the profile of the radiation-sensitive material includes determining a number of photons of the first radiation exposure step or the second radiation exposure step absorbed by the volume of the radiation-sensitive material.

9. The method of claim 6, wherein calculating the profile of the radiation-sensitive material includes determining the number of the acid generators converted to acid by the first radiation exposure step or by photosensitizer activation by the second radiation exposure step and subsequent acid generator decomposition by excited photosensitizer.

10. The method of claim 6, wherein calculating the profile of the radiation-sensitive material includes determining the number of the photo-decomposable quenchers decomposed by the first radiation exposure step or the second radiation exposure step.

11. The method of claim 6, wherein calculating the profile of the radiation-sensitive material includes determining a number of acid and quencher neutralization reactions within the volume of the radiation-sensitive material.

12. The method of claim 6, wherein calculating the profile of the radiation-sensitive material includes determining the number of acid induced de-protection reactions of a protected polymer.

13. The method of claim 6, wherein calculating the profile of the radiation-sensitive material includes calculating a development of the volume of the radiation-sensitive material.

14. The method of claim 13, wherein calculating the profile of the radiation-sensitive material includes producing with the data processor a two-or three-dimensional image of the profile of the radiation-sensitive material created by the development of the volume of the radiation-sensitive material.

15. The method of claim 6, wherein calculating the profile of the radiation-sensitive material includes determining the dimensional properties of the profile of the radiation-sensitive material.

* * * * *